(12) United States Patent
Lee et al.

(10) Patent No.: US 12,349,488 B2
(45) Date of Patent: Jul. 1, 2025

(54) IMAGE SENSOR WITH COLOR FILTERS WITH CONVEX SURFACES

(71) Applicant: SAMSUNG ELECTRONICS CO., LTD., Suwon-si (KR)

(72) Inventors: Seungwook Lee, Hwaseong-si (KR); Mihye Kim, Hwaseong-si (KR); Haewon Lee, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 470 days.

(21) Appl. No.: 17/487,249

(22) Filed: Sep. 28, 2021

(65) Prior Publication Data

US 2022/0216258 A1    Jul. 7, 2022

(30) Foreign Application Priority Data

Jan. 4, 2021 (KR) .................. 10-2021-0000276

(51) Int. Cl.
*H10F 39/00* (2025.01)
*H04N 25/704* (2023.01)
*H10F 39/18* (2025.01)

(52) U.S. Cl.
CPC ....... *H10F 39/8053* (2025.01); *H04N 25/704* (2023.01); *H10F 39/024* (2025.01);
(Continued)

(58) Field of Classification Search
CPC ......... H01L 27/14621; H01L 27/14627; H01L 27/1463; H01L 27/14645; H01L 27/14685;
(Continued)

(56) References Cited

U.S. PATENT DOCUMENTS 9,513,411 B2   12/2016  Wu et al.
10,276,616 B2   4/2019  Shibuta
(Continued)

FOREIGN PATENT DOCUMENTS

KR   10-2009-0069566 A   7/2009
KR   10-2016-0106337 A   9/2016
(Continued)

*Primary Examiner* — Nduka E Ojeh
*Assistant Examiner* — Laura M Dykes
(74) *Attorney, Agent, or Firm* — Morgan, Lewis & Bockius LLP

(57) ABSTRACT

An image sensor includes a substrate that includes first and second surfaces that oppose each other in a first direction and pixel areas arranged in directions parallel to the first surface, a first device isolation film that separates the pixel areas, four photodiodes disposed in each of the pixel areas inside of the substrate, and arranged in a 2×2 array, a second device isolation film that separates the four photodiodes from each other, a color filter disposed on the first surface of the substrate, and that includes four regions that respectively correspond to the four photodiodes, wherein each region has a convex upper surface, and a first microlens disposed above the color filter and that corresponds to each of the pixel areas. Accordingly, in the image sensor, light incident on the internal device isolation film is reduced, and loss of autofocusing sensitivity of the image sensor is reduced.

20 Claims, 22 Drawing Sheets

(52) U.S. Cl.
CPC ....... *H10F 39/182* (2025.01); *H10F 39/8063* (2025.01); *H10F 39/807* (2025.01)

(58) Field of Classification Search
CPC ......... H01L 27/14605; H01L 27/14643; H01L 27/1461; H04N 25/704; H04N 25/134
USPC ....................................................... 257/432
See application file for complete search history.

(56) References Cited

U.S. PATENT DOCUMENTS

| | | | |
|---|---|---|---|
| 2005/0029433 A1* | 2/2005 | Sakoh | H01L 27/14806 257/E27.151 |
| 2009/0206433 A1 | 8/2009 | Kang | |
| 2013/0234273 A1 | 9/2013 | Lee et al. | |
| 2014/0284455 A1* | 9/2014 | Hiramoto | H01L 27/14625 257/432 |
| 2016/0033688 A1* | 2/2016 | Wu | G02B 5/201 216/26 |
| 2016/0080359 A1 | 2/2016 | Nakata | |
| 2016/0260762 A1 | 9/2016 | Ungnapatanin et al. | |
| 2017/0366770 A1 | 12/2017 | Yokogawa et al. | |
| 2018/0026065 A1* | 1/2018 | Hsieh | H01L 27/14605 257/432 |
| 2018/0254297 A1 | 9/2018 | Cho | |
| 2020/0303432 A1 | 9/2020 | Shibuta | |
| 2020/0403025 A1 | 12/2020 | Kim et al. | |
| 2023/0232125 A1* | 7/2023 | Nakamizo | H04N 25/13 257/431 |
| 2023/0387166 A1* | 11/2023 | Tanaka | H01L 27/146 |

FOREIGN PATENT DOCUMENTS

| | | |
|---|---|---|
| KR | 10-2017-0098809 A | 8/2017 |
| KR | 10-2018-0101735 A | 9/2018 |
| KR | 10-1909144 | 10/2018 |
| KR | 10-2018-0127327 | 11/2018 |
| KR | 10-2020-0145978 A | 12/2020 |

* cited by examiner

IMAGE SENSOR WITH COLOR FILTERS WITH CONVEX SURFACES

CROSS-REFERENCE TO RJELAFED APPLICAIION(S)

This application claims priority under 35 USC 119(a) from Korean Patent Application No. 10-2021-0000276, filed on Jan. 4, 2021 in the Korean Intellectual Property Office, the contents of which are herein incorporated by reference in their entirety.

BACKGROUND

Technical Field

Embodiments of the present inventive concept are directed to an image sensor.

Discussion of the Related Art

Image sensors are semiconductor devices that convert optical images into electrical signals. Among such image sensors, a Complementary Metal Oxide Semiconductor (CMOS) type image sensor is abbreviated as a CMOS image Sensor (CIS). A CIS includes a plurality of pixel areas, and each of the pixel areas includes at least one photodiode (PD) that converts incident light into an electrical signal. On the other hand, a CIS that includes tour photodiodes in one pixel area can have improved autofocusing performance. However, a device isolation film in the pixel area can cause a loss of autofocusing sensitivity.

SUMMARY

Exemplary embodiments provide an image sensor that reduces light incident on internal device isolation film using an image sensor that includes a color filter that has convex surfaces for each pixel area, and that reduces autofocusing sensitivity loss.

According to an exemplary embodiment, an image sensor includes a substrate that includes a first surface and a second surface that oppose each other in a first direction and a plurality of pixel areas arranged in directions parallel to the first surface; a first device isolation film that separates each of the plurality of pixel areas; four photodiodes disposed in each of the plurality of pixel areas inside of the substrate, and arranged in a 2×2 array in directions parallel to the first surface; a second device isolation film that separates the four photodiodes from each other; a color filter disposed on the first surface of the substrate and that includes four regions that correspond to the four photodiodes, respectively, where each of the four regions has a convex upper surface; and a first microlens disposed above the color filter and that corresponds to each of the pixel areas.

According to an exemplary embodiment, an image sensor includes a pixel array that includes a plurality of pixel groups arranged in directions parallel to an upper surface of a substrate, where each of the plurality of pixel groups includes a plurality of pixel areas; and a logic circuit that obtains a pixel signal from each of the plurality of pixel areas. Each of the plurality of pixel areas includes four photodiodes arranged in a 2×2 array in directions parallel to the upper surface of the substrate, a color filter disposed on the upper surface of the substrate, and a microlens disposed above the color filter, and the color filter has the same color for each of the plurality of pixel areas and includes four regions that respectively correspond to each of the four photodiodes, wherein each of the four regions has a convex upper surface.

According to an exemplary embodiment, an image sensor includes a substrate; a first device isolation film that separates pixel areas disposed in directions parallel to an upper surface of the substrate; four photodiodes disposed in each of the pixel areas inside of the substrate and arranged in a 2×2 array in directions parallel to the upper surface of the substrate; a second device isolation film that separates the four photodiodes from each other; a first microlens disposed above the substrate and that corresponds to each of the pixel areas, where the first microlens primarily refracts incident light; and a color filter disposed on the upper surface of the substrate and below the first microlens, where the color filter includes four regions that respectively correspond to the four photodiodes, and extracts a light component that has a predetermined wavelength from the primarily refracted incident light and produces secondarily refracted light.

DETAILED DESCRIPTION

Figure 1:
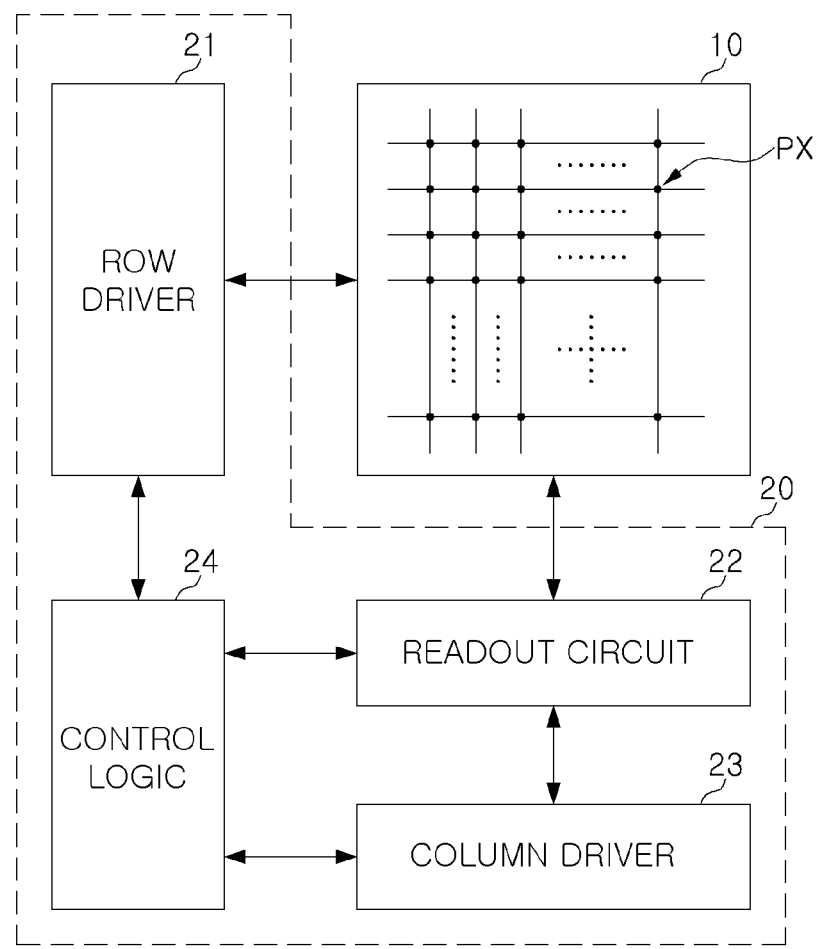
FIG. 1 is a block diagram of an image sensor according to an exemplary embodiment.

Hereinafter, exemplary embodiments will be described with reference to the accompanying drawings., FIG. 1 is a block diagram of an image sensor according to an exemplary embodiment.

Referring to FIG. 1, an image sensor 1 according to an exemplary embodiment includes a pixel array 10 and a logic circuit 20.

In an embodiment, the pixel array 10 includes a plurality of unit pixels PX disposed in an array in a plurality of rows and a plurality of columns. Each of the unit pixels PX includes at least one photoelectric conversion element that generates electric charges in response to light, and a pixel circuit that generates a pixel signal that corresponds to the electric charges generated by the photoelectric conversion element.

The photoelectric conversion device includes a photodiode formed of a semiconductor material, and/or an organic photodiode formed of an organic material. In an exemplary embodiment, each of the unit pixels PX includes two or more photoelectric conversion elements, and the two or more photoelectric conversion elements in one unit pixel PX respond to light of it different colors and generate electric charges.

In an exemplary embodiment, each unit pixel PX includes a first photodiode, a second photodiode, a third photodiode, and a fourth photodiode, and the lint to fourth photodiodes respond to light in different wavelength bands and respectively generate electric charges, but embodiments are not limited thereto.

Depending on exemplary embodiments, the pixel circuit may include a transfer transistor, a driving transistor, a selection transistor, and a reset transistor. When each of the unit pixels PX includes two or more photoelectric conversion elements, each of the unit pixels PX includes a pixel circuit that processes charges generated by each of the two or more photoelectric conversion elements. For example, when each of the unit pixels PX has four photoelectric conversion elements, the pixel circuit includes four or more of at least one of a transfer transistor, a driving transistor, a selection transistor, and a reset transistor. However, embodiments are not limited to this configuration, and in other embodiments, at least some of the photoelectric conversion elements also share a portion of the transistors.

In an embodiment, the logic circuit 20 includes circuits that control the pixel array 10. For example, the logic circuit 20 includes a row driver 21, a readout circuit 22, a column driver 23, and a control logic 24.

In an embodiment, the row driver 21 drives the pixel array 10 in a row unit. For example, the row driver 21 generates a transmission control signal that controls a transfer transistor of a pixel circuit, a reset control signal that controls the reset transistor, a selection control signal that controls the selection transistor, etc., and inputs the signal to the pixel array 10 in a row unit.

In an embodiment, the readout circuit 22 includes a correlated double sampler (CDS), an analog-to-digital converter (ADC), etc. The correlated double sampler is connected to the unit pixels PX through column lines. The correlated double samplers performs correlated double sampling by receiving pixel signals from unit pixels PX connected to a row line selected by a row line selection signal of the row driver 21. The pixel signal is received through the column lines. The analog-to-digital converter converts the pixel signal detected by the correlated double sampler into a digital pixel signal and transmits the digital pixel signal to the column driver 23.

In an embodiment, the column driver 23 includes an amplifying, circuit and a latch or buffer circuit that temporarily stores a digital pixel signal, etc., and processes the digital pixel signal received from the readout circuit 22, The row driver 21, the readout circuit 22, and the column driver 23 are controlled by the control logic 24. The control logic 24 includes a timing controller that controls the operation timing of the row driver 21, the readout circuit 22, and the column driver 23.

In an embodiment, among the unit pixels PX, those unit pixels PX disposed in the same position in the horizontal direction share the same column line. For example, those unit pixels PX disposed in the same position in the vertical direction are simultaneously selected by the row driver 21 and output pixel signals through column lines. In an exemplary embodiment, the readout circuit 22 simultaneously obtains pixel signals from the unit pixels PX selected by the row driver 21 through column lines. The pixel signals include a reset voltage and a pixel voltage. However, embodiments are not the configuration shown in FIG. 1, and in other embodiments, the image sensor may additionally include other components and may be driven in other ways.

Figure 2:
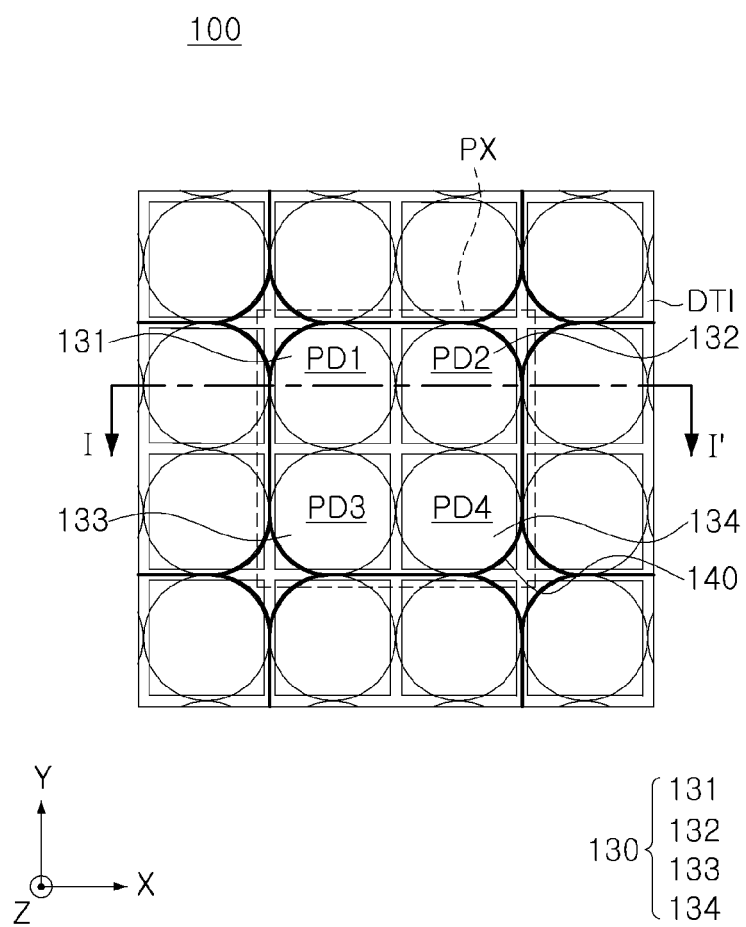
FIG. 2 is a top view of an image sensor according to an exemplary embodiment.

FIG. 2 is a top view of an image sensor according to an exemplary embodiment.

In general, in an image sensor that includes four photodiodes in one pixel area, the four photodiodes share one microlens to increase autofocusing performance by acquiring autofocusing information of all pixel areas. On the other hand, the respective photodiodes are separated by an internal device isolation film, and light incident through the microlens is refracted as the light enters the pixel area. However, due to the structural characteristics of the internal device isolation film, incident light may be concentrated and absorbed by the internal device isolation film. Accordingly, in a general image sensor, autofocusing sensitivity loss may occur.

Referring to FIG. 2, an image sensor 100 according to an exemplary embodiment of the present inventive concept includes a device isolation film DTI that separates photodiodes PD1, PD2, PD3, and PD4. For example, the pixel areas PX are arranged in directions parallel to a first plane, such as an X-Y plane. For example, each of the pixel areas PX includes photodiodes PD1, PD2, PD3, and PD4 arranged in 2/2 form in directions parallel to the first plane.

On the other hand, to prevent the autofocusing sensitivity loss that can occur in a general image sensor that includes four photodiodes in one pixel area, the image sensor 100 according to an exemplary embodiment of the present inventive concept includes color filters 131, 132, 133 and 134 of color filter 130 that each have a convex upper surface. For example, the color filter 130 includes four regions 131, 132, 133, and 134 that correspond to the photodiodes PD1, PD2, PD3, and PD4, respectively. For example, each of the four regions 131, 132, 133, and 134 has a convex upper surface. Hereinafter, each of the four regions 131, 132, 133, and 134 is referred to as the color filter 130.

The image sensor 100 according to an exemplary embodiment includes a first microlens 140 that corresponds to each of the pixel areas PX. For example, the first microlens 140 is disposed above the color filter 130. In detail, in one pixel area PX, a ratio of the number of first microlenses 140 and the number of areas in die color filter 130 and that have a convex upper surface is 1:4. Accordingly, each of the four regions in the color filter 130 has an area different from that of the first microlens 140. On the other hand, the first microlens 140 and the convex upper surface in the color filter 130 are circular in a plan view. However, embodiments of the present inventive concept are not limited thereto, and in other embodiments, the first microlens 140 and/or the convex upper surface in the color filter 130 may have a rectangular shape with rounded corners. For example, in the exemplary embodiment illustrated in FIG. 2, the first microlens 140 has a relatively large diameter with respect to the optical axis. In addition, a length of the first microlens 140 in a direction parallel to the arrangement direction of the pixel, areas PX is less than the length of the first microlens 140 in a diagonal direction. For example, in a direction parallel to the arrangement direction of the pixel areas PX, the length of the first microlens 140 is twice the diameter of a circular convex upper surface in the color filter 130. On the other hand, in a direction that is diagonal to the arrangement direction of the pixel areas PX, the length of the first microlens 140 is greater than twice the diameter of a circular convex upper surface in the color filter 130. However, embodiments are not limited thereto, and in other embodiments, the shapes of the first microlens 140 and the color filter 130 can vary from those illustrated.

Figure 3:
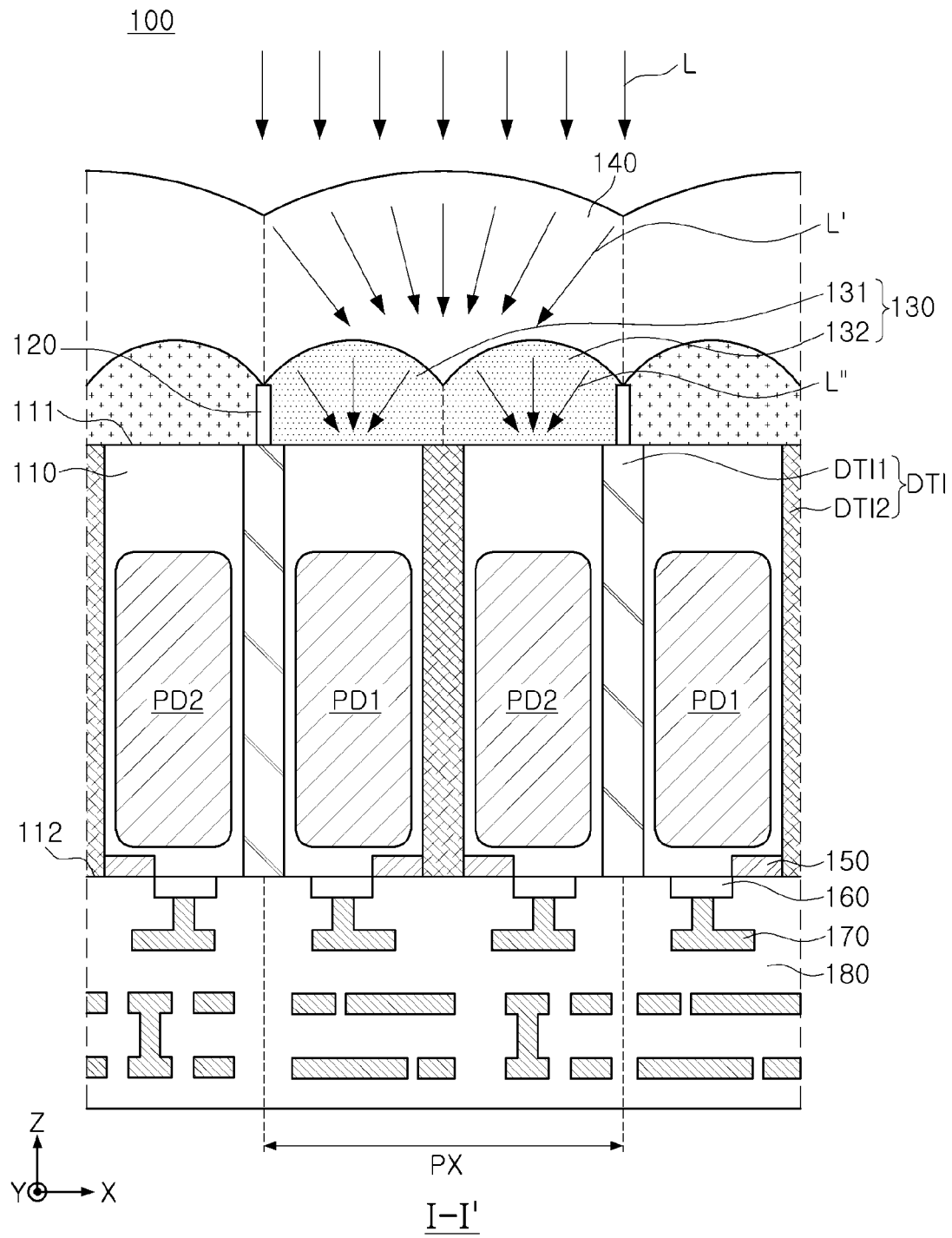
FIG. 3 is a cross-sectional view of an image sensor according to an exemplary embodiment.

FIG. 3 is a cross-sectional view of an image sensor according to an exemplary embodiment.

FIG. 3 is a cross-sectional view of the image sensor 100 taken along line I-I' in FIG. 2. Referring to FIG. 3, the image sensor 100 according to an exemplary embodiment includes a substrate 110, a color filter 130, and a first microlens 140 disposed on the color filter 130 in a first direction, such as a Z direction. For example, the substrate 110 includes a first surface 111 and a second surface 112 that oppose each other in the first direction. In the image sensor 100 according to an exemplary embodiment, the pixel areas PX are arranged in directions parallel to the first surface 111 of the substrate 110. In addition, other circuits necessary for the operation of the image sensor 100 are disposed on the upper surface of the second surface 112 of the substrate 110. For example, the substrate 110 can be a semiconductor substrate, and photodiodes PD1 and PD2 that receive light are disposed inside of the substrate 110. However, although two photodiodes PD1 and PD2 are illustrated in FIG. 3, when referring to FIG. 2 together, at least four photodiodes PD1, PD2, PD3, and PD4 are included in one pixel area PX. For example, the four photodiodes PD1, PD2, PD3, and PD4 are arranged in a 2×2 array in directions parallel to the first surface 111. However, this is only an example and embodiments are not limited to this configuration.

In the image sensor 100 according to an exemplary embodiment, the pixel areas PX are separated by the first device isolation film DTI1. On the other hand, the photodiodes PD1, PD2, PD3, and PD4 in the pixel area PX are separated by the second device isolation film DTI2. For example, the first device isolation film DTI1 is an insulating layer that separates the pixel areas PX from each other, and the second device isolation film DTI2 is an insulating film that improves the performance of the image sensor 100 by controlling the movement of electrons within one pixel area PX. For example, the first device isolation film DTI1 and the second device isolation film am respectively extend in the first direction and include an insulating material. On the other hand, the second device isolation film DTI2 extends between the photodiodes PD1, PD2, PD3, and PD4 in a second direction, such as an X direction, and a third direction, such as a Y direction, from the first device isolation film DTI1, where each of the second and third directions is perpendicular to the first direction.

The image sensor 100 according to an exemplary embodiment includes the color filter 130 disposed on le first surface 111 of the substrate 110. The color filter 130 is divided into four regions 131, 132, 133 and 134, and the four regions 131, 132, 133 and 134 correspond to the four photodiodes PD1 PD2, PD3 and PD4, respectively. In detail, the four regions 131, 132, 133, and 134 are also arranged in 2×2 form like the photodiodes PD1, PD2, PD3, and PD4, and each of the four regions 131, 132, 133 and 134 has a convex upper surface. One pixel area PX includes the color filter 130 of the same color. For example, the color of file color filter 130 may be any one of green, red, and blue. However, this is only an example, and the colors of the color filter 130 may be different colors as necessary.

In an embodiment, the image sensor 100 includes the first microlens 140 disposed above the. color filter 130. For example, the first microlens 140 corresponds to the pixel area PX. On the other hand, the first microlens 140 and the four regions 131, 132, 133, and 134 in the color filter 130 have different optical axes. For example, the optical axis of the first microlens 140 overlaps the second device isolation film DTI2 in the first direction. in addition, the optical axes of the four regions 131, 132, 133, and 134 in the color filter 130 overlap the four photodiodes PD1, PD2, PD3, and PD4 in the first direction, respectively.

In the image sensor 100 according to an exemplary embodiment, the curvature of the first microlens 140 is less than the curvature of each of the four regions 131, 132, 133, and 134 in the color filter 130. Accordingly, the first microlens 140 can collect incident light so that the incident light does not deviate from the pixel area PX of the first microlens 140. On the other hand, the four regions 131, 132, 133, and 134 in the color filter 130 can reduce absorption of incident light into the second device isolation film DTI2. However, this is only an example and embodiments are not limited to this configuration, and in other embodiments, the curvatures of the first microlens 140 and the four regions 131, 132, 133 and 134 in the color filter 130 can vary as necessary.

However, a configuration and shape of the image sensor 100 according to an exemplary embodiment are not limited to those illustrated in FIG. 3, and other configurations may be added or omitted depending on exemplary embodiments, and the shape can change. For example, in an embodiment, the color filter 130 includes an autofocusing barrier 120 that prevents light incident on the first microlens 140 from entering another pixel area PX. The autofocusing barrier 120 is disposed on the upper surface of the first device isolation film DTI1. However, this is only an example and the configuration is not limited thereto, and in other embodiments, the autofocusing barrier 120 can be disposed on a portion of the boundaries of the four regions 131, 132, 133, and 134 in the color filter 130. In addition, a light transmitting layer may be further included between the first microlens 140 and the color filter 130.

In the image sensor 100 according to an exemplary embodiment, light L incident on the image sensor 100 passes through the first microlens 140 and is refracted into first refracted light L'. For example, the first refracted light L' propagates toward the center of the first microlens 140. The second device isolation film DTI2 is disposed on the center of the first microlens 140. The first refracted light L' passes through the color filter 130 and is refracted into second refracted light L". For example, the color filter 130 extracts a component having a predetermined wavelength from the first refracted light L'. The secondly refracted light L" enters the substrate 110 rather than the second device isolation film DTI2. Accordingly, the image sensor 100 according to an exemplary embodiment improves the performance of the image sensor 100 by reducing light absorption by the second device isolation film DTI2 and by reducing autofocusing sensitivity loss.

In an embodiment, a pixel circuit is disposed on the second surface 112 of the image sensor 100. For example, the pixel circuit includes a plurality of elements 160, wiring patterns 170 connected to the plurality of elements 160, and an insulation layer 180 that covers the plurality of elements 160 and the wiring patterns 170, etc., and that are disposed on the second surface 112 of the substrate 110. The pixel circuit includes a floating diffusion region 150. For example, each of the pixel areas PX1, PX2, PX3, and PX4 includes the floating diffusion region 150 disposed below the plurality of photodiodes PD1 and PD2. For example, the respective floating diffusion regions 150 are electrically connected to each other by at least one of the wiring patterns 170, and respective locations and areas of the floating diffusion regions 150 can vary depending on exemplary embodiments. In the image sensor 100 according to an exemplary embodiment, the plurality of elements 160 adjacent to the floating diffusion region 150 are transfer transistors. For example, the transfer transistor gate has a vertical structure in which at least a partial region is buried in the substrate 110. However, this is only an example and the configuration is not limited thereto, and in other embodiments, the transfer transistors share one floating diffusion region 150 within one pixel area PX.

FIGS. 4 to 7 schematically illustrate a pixel array of an image sensor according to exemplary embodiments.

Figure 4:
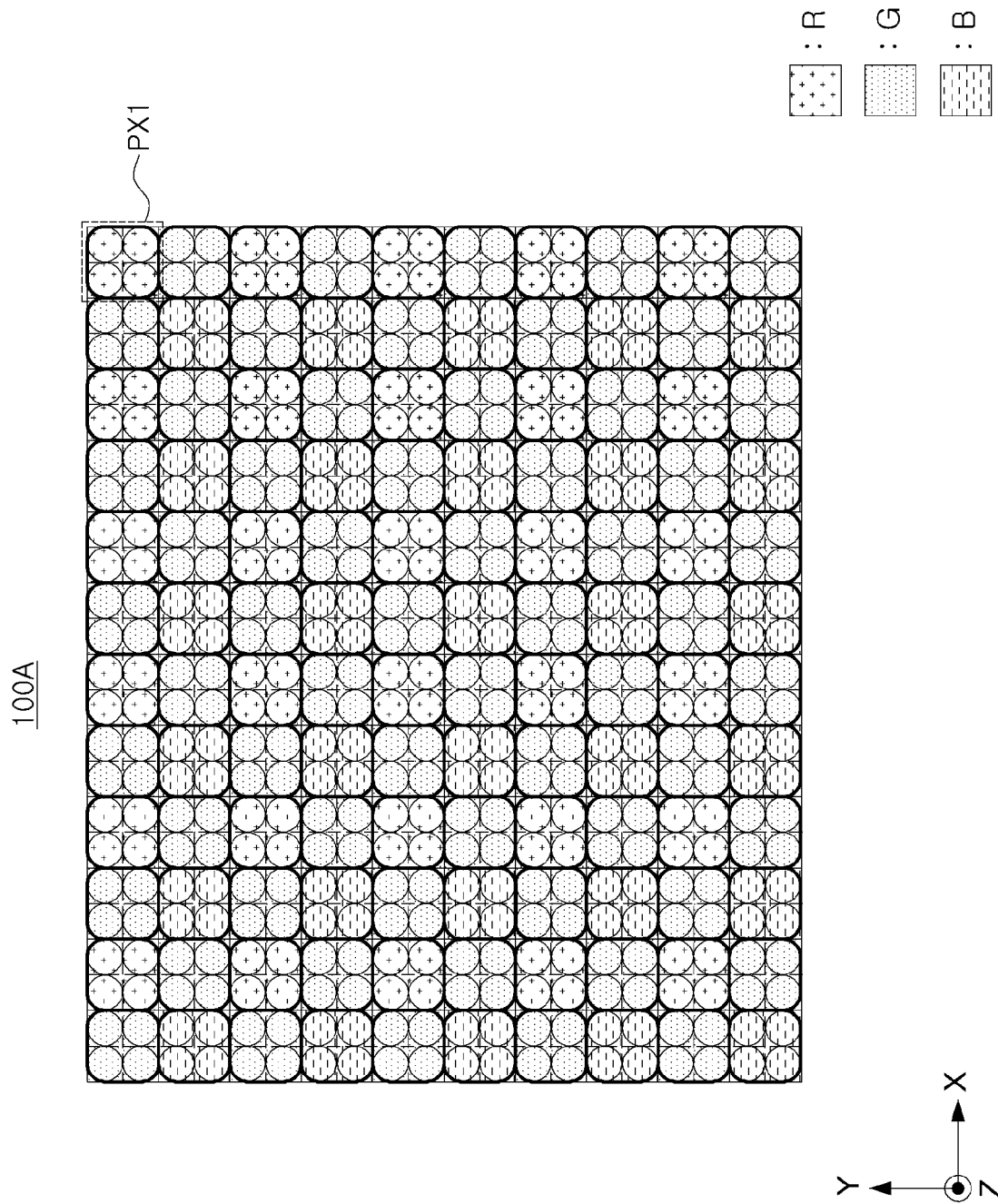
FIGS. 4 to 7 schematically illustrate a pixel array of an image sensor according to exemplary embodiments.

First, referring to FIG. 4, a pixel array 100A, of an image sensor according to an exemplary embodiment includes a plurality of pixel areas PX1. For example, each of the pixel areas PX1 includes first to fourth photodiodes. In the exemplary embodiment illustrated in FIG. 4, each of the pixel areas PX1 in the pixel array 100A is an autofocusing pixel area PX1. In the autofocusing pixel area PX1, the first to fourth photodiodes, are arranged in 2×2 form, and the first to fourth photodiodes share one microlens. In the pixel array 100A of an image sensor according to an exemplary embodiment, the autofocusing pixel area PX1 includes a color filter that includes regions that. have convex upper surfaces that correspond to the first to fourth photodiodes, respectively. However, this is only an example and the configuration is not limited thereto, and in other embodiments, the arrangement of the first to fourth photodiodes and the shape of the color filter in at least a portion of the pixel areas PX1 can be modified. In addition, according to an exemplary embodiment, only a portion of the pixel areas PX1 is used for the autofocusing function.

Figure 5:
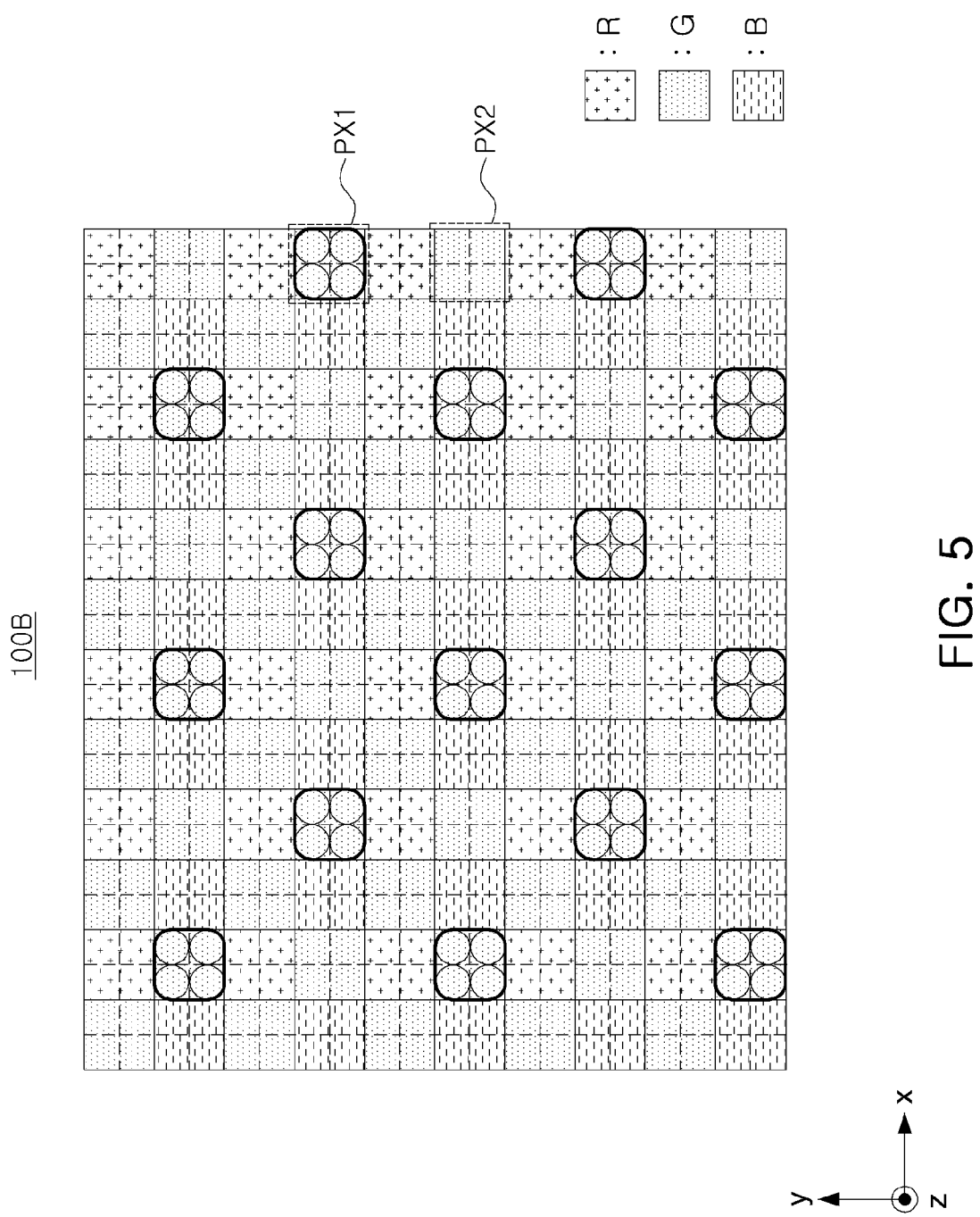

Referring to FIG. 5, a pixel array 100B of an image sensor according to an exemplary embodiment includes an autofocusing pixel area PX1 and a general pixel area PX2. A plurality of each of the autofocusing pixel area PX1 and the general pixel area PX2 are provided, and the number of autofocusing pixel areas PX1 and the number of general pixel areas PX2 can vary. For example, the number of general pixel areas PX2 is greater than the number autofocusing pixel areas PX1. In addition, the positions of the autofocusing pixel areas PX1 are not limited to those illustrated in FIG. 5, and can be modified in other embodiments.

Figure 6:
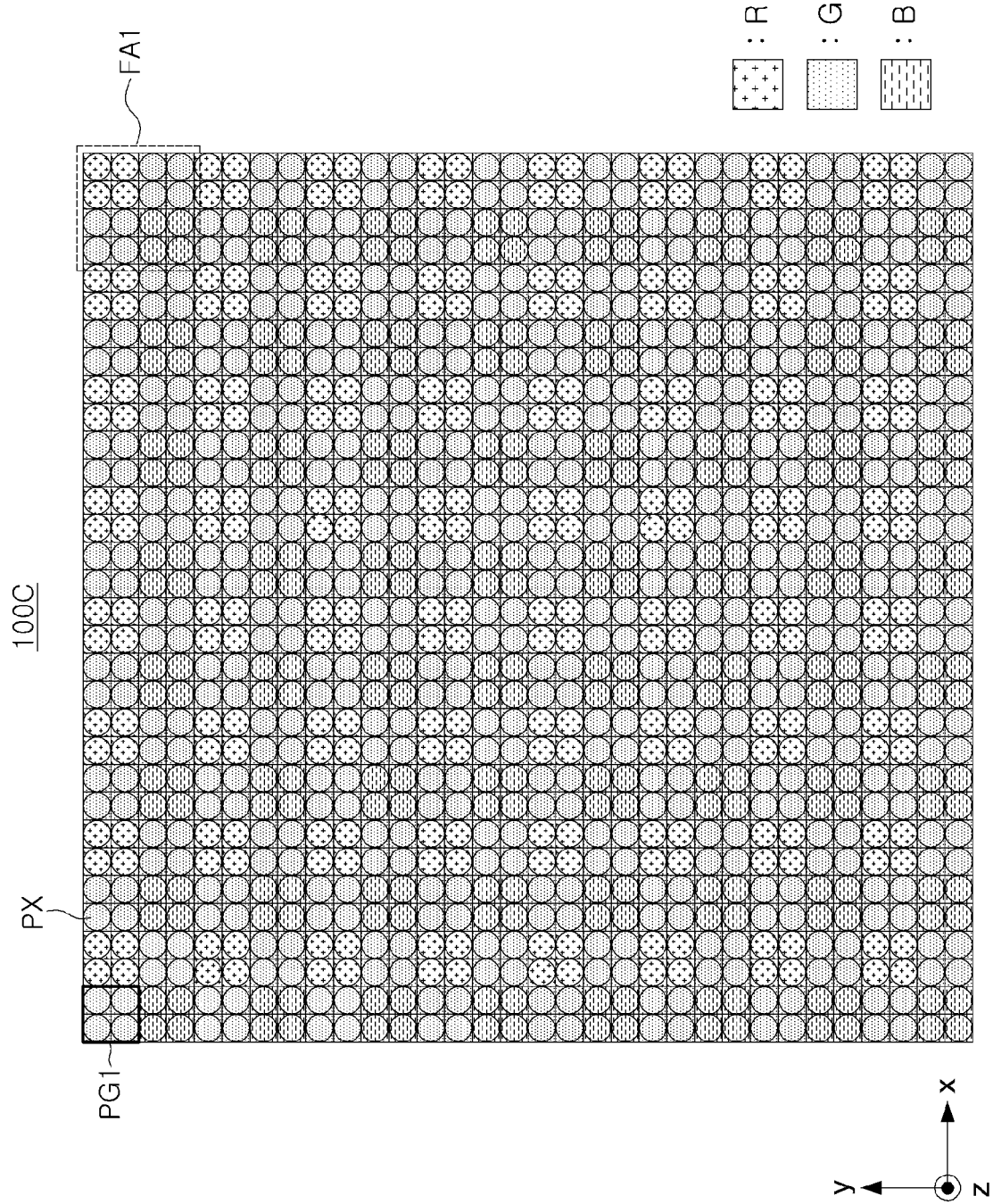
Figure 7:
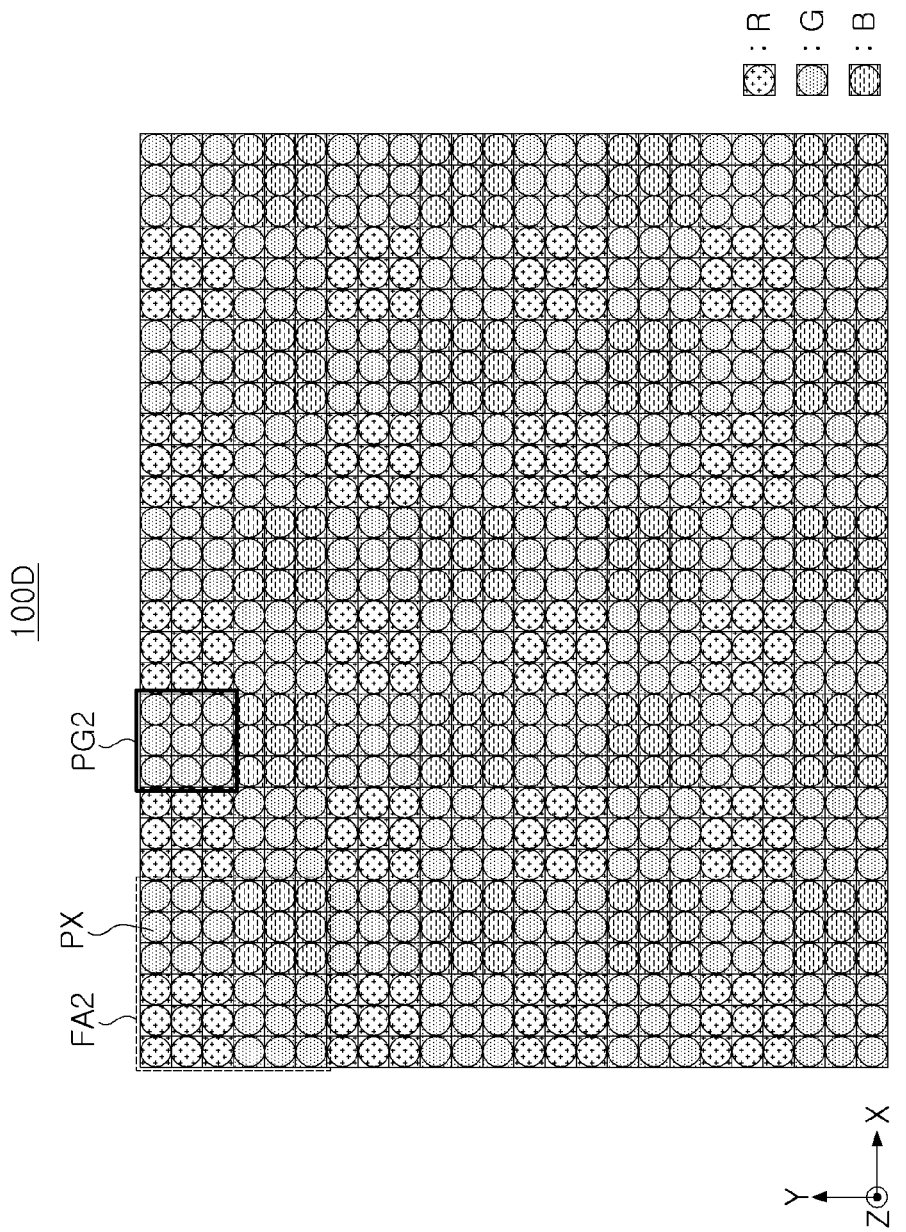

Next, referring to FIG. 6, a pixel array 100C according to an exemplary embodiment includes a plurality of pixel groups PG1 arranged in directions parallel to the upper surface of the substrate. In addition, each of the plurality of pixel groups PG1 includes pixel areas PX. For example, each of the pixel areas PX includes first to fourth photodiodes. The pixel areas PX may be autofocusing pixel areas or general pixel areas. However, this is only an example and the configuration is not limited thereto. According to exemplary embodiments, only a portion of the pixel areas PX include first to fourth photodiodes, and in other embodiments, the numbers and arrangements of photodiodes in some of the pixel areas PX are different.

The pixel array 100C according to an exemplary embodiment includes a color filter that is arranged to generate an image having a Tetra pattern. For example, the color filter includes regions having a convex upper surface as illustrated in FIG. 4. For example, the pixel array 100C of the image sensor has a 4×4 tetra color filter array FA1 in which red, green, green, and blue filters are each arranged in a 2×2 form. On the other hand, each of the plurality of pixel groups PG1 includes 2×2 pixel areas PX. The 2×2 pixel areas PX in the plurality of pixel groups PG1 include color filters of the same color. For example, each of the pixel areas PX includes four regions that have a convex upper surface, and each of the four legions corresponds to a photodiode. For example, the tetra color filter arrays FA1 repeatedly arranged as described above constitute the pixel array 100C. However, this is only an example, and in other embodiments, an arrangement of repetitively configured color filters can vary.

On the other hand, referring to FIG, 7, a pixel array 100D of an image sensor according to an exemplary embodiment includes a plurality of pixel groups PG2, similar to the pixel array 100C illustrated in FIG. 6. The pixel areas PX in each of the pixel groups PG2 include color filters of the same color. In addition, the color filter includes regions that have a convex upper surface as illustrated in FIG. 4. However, unlike the pixel array 100C illustrated in FIG. 6, each of the plurality of pixel groups PG2 in the pixel array 100D includes 3×3 pixel areas PX. The pixel array 100D of the image sensor according to the exemplary embodiment includes a color filter that is arranged to generate an image that has a nona pattern. For example, the pixel array 100D of the image sensor has a 6×6 nona color filter array FA2 in which red, green, green, and blue are each arranged in a 3×3 form. However, this is only an example, and in other embodiments, the arrangement of repetitively configured color filters can vary.

In exemplary embodiments described with reference to FIGS. 4 to 7, each of the pixel areas PX are separated by a first device isolation film, and a second device isolation film is disposed between the first to fourth photodiodes in each of the pixel areas PX. For example, a light-receiving area of each of the first to fourth photodiodes is determined by the first device isolation film and the second device isolation film. For example, if the second device isolation film is not accurately aligned between the first to fourth photodiodes, the light-receiving area of at least one of the first to fourth photodiodes may be different from a light-receiving area of the others, and autofocusing performance of the image sensor can deteriorate. On the other hand, as described above, when the second device isolation film is accurately aligned between the first to fourth photodiodes, incident light is absorbed by the second device isolation film, thereby increasing autofoousing sensitivity loss.

In an image sensor that includes the pixel arrays 100A, 100B, 100C, and 100D, according to an exemplary embodiment of the present inventive concept illustrated in FIGS. 4 to 7, include a microlens that produces first refracted light and a color filter that extracts a light component that has a predetermined wavelength from the first refracted light and produces second refracted light to reduce autofocusing sensitivity loss. For example, the difference in the light-receiving area of the first photodiode and the second photodiode can be significantly reduced by accurately aligning an internal separation film of the pixel, and light incident on the second device isolation film can be significantly reduced using the second refraction by a color filter, to allow light to be absorbed by the substrate. Therefore, deterioration of the autofocusing function of the image sensor can be prevented, and the loss of autofocusing sensitivity can be significantly reduced. In addition, an image sensor according to an exemplary embodiment further includes a logic circuit that obtains a pixel signal from the pixel areas PX in the pixel arrays 100A, 100B, 100C, and 100D, for operation.

FIGS. 8 to 11 are cross-sectional views of image sensors according to exemplary embodiments.

Figure 8:
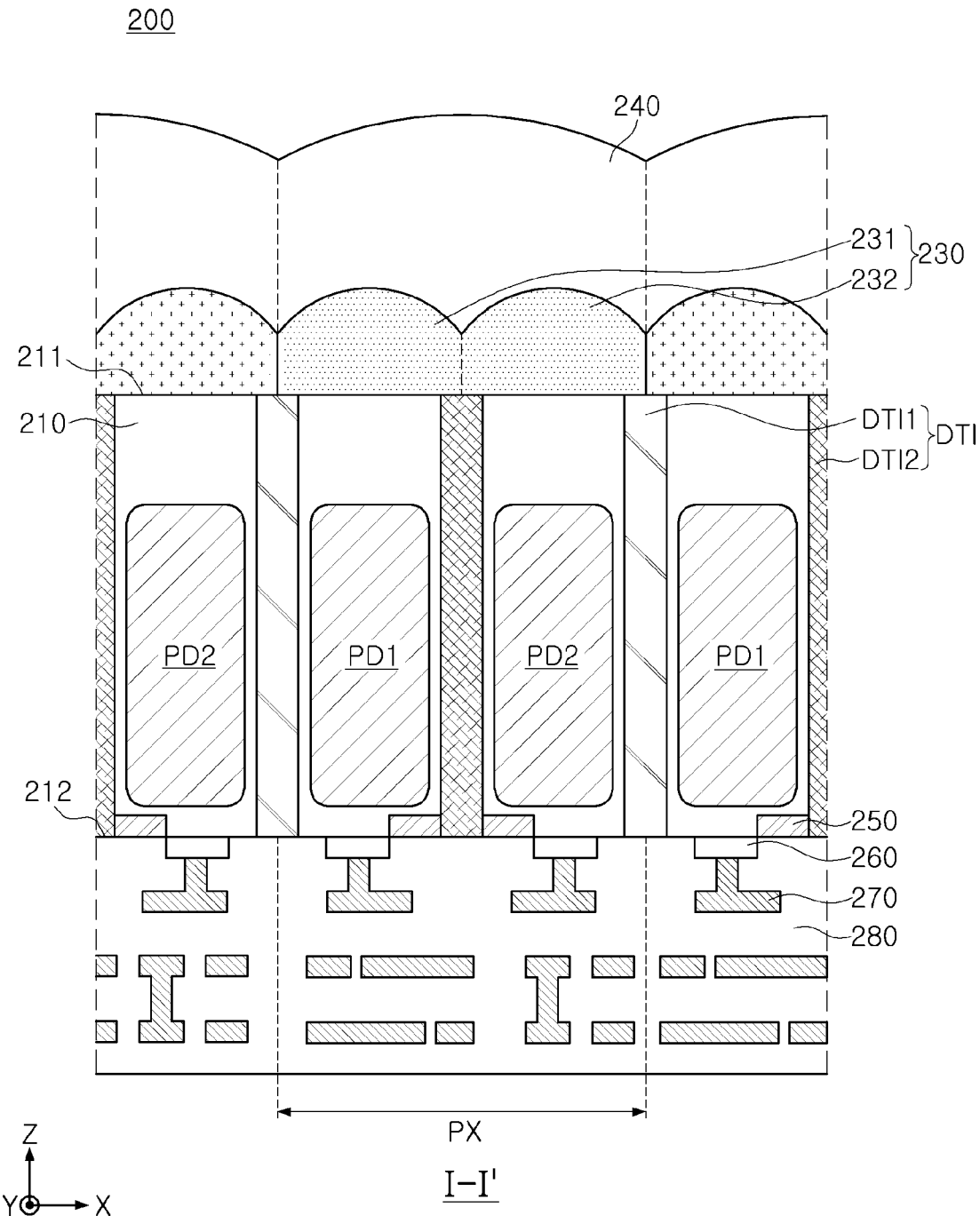
FIGS. 8 to 11 are cross-sectional views of image sensors according to exemplary embodiments.

First, referring to FIG. 8, an image sensor 200 according to an exemplary embodiment does not include the autofocusing barrier 120 included in the image sensor 100 illustrated in FIG. 3. However, other configurations of the image sensor 200 illustrated in FIG. 8 correspond to the configurations of the image sensor 100. The image sensor 200 according to an exemplary embodiment secondarily refracts incident light using a curved color filter 230, so that light leaking to the other pixel areas PX can be reduced. In addition, since the autofocusing barrier 120 is formed by a separate process, process steps may be reduced.

Figure 9:
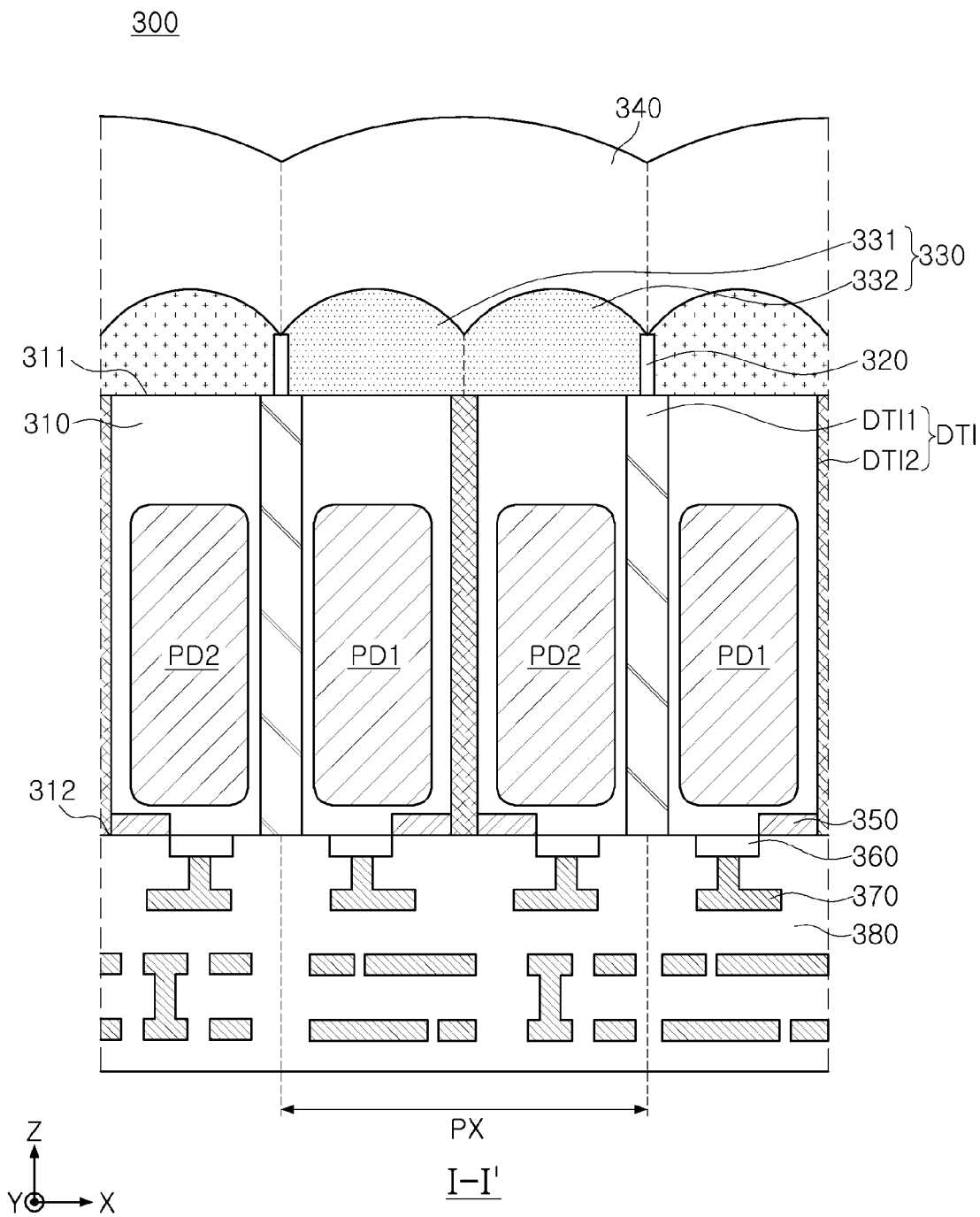

Referring to FIG. 9, unlike the image sensor 100 illustrated in FIG. 3, an image sensor 300 according to an exemplary embodiment includes a. first device isolation film DTI1 and a second device isolation film DTI2 that have different thicknesses. For example, the thickness in the second direction of the second device isolation film DTI2 is less than the thickness of the first device isolation film DTI1. However, other configurations of the image sensor 300 illustrated in FIG. 9 correspond to the configurations of the image sensor 100.

Figure 10:
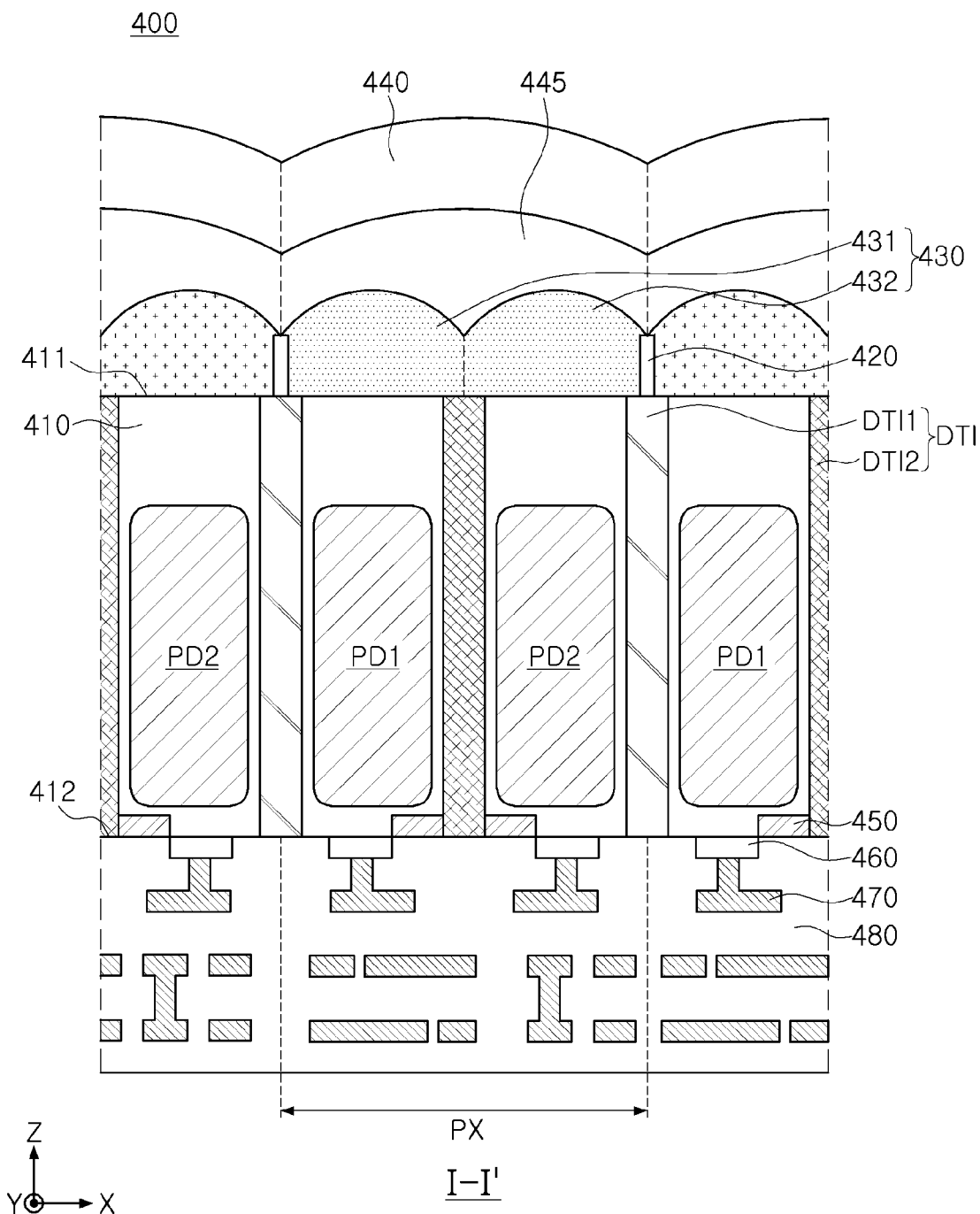
Figure 11:
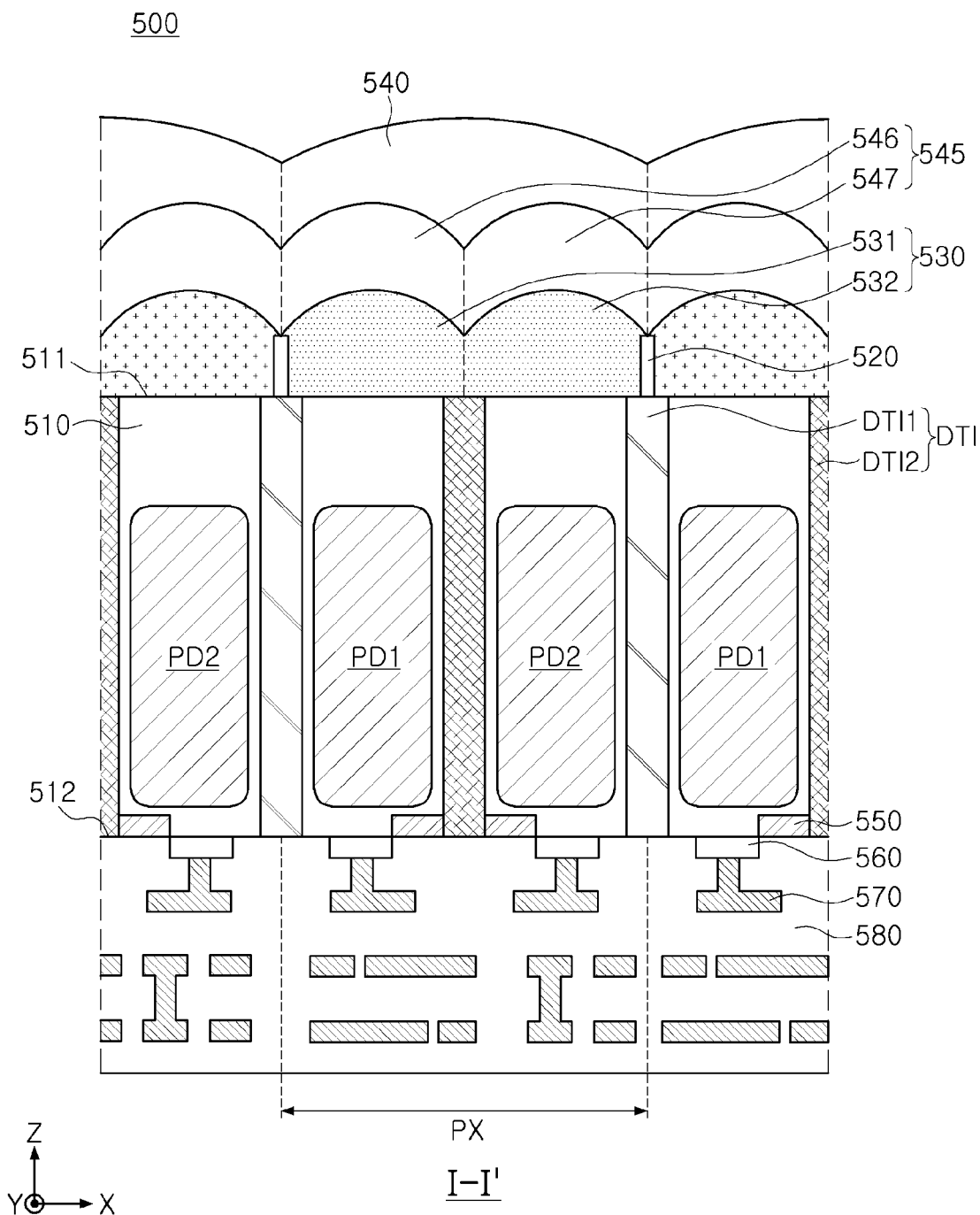

Referring to FIGS. 10 and 11, image sensors 400 and 500 according to exemplary embodiments include configurations that correspond to the configurations of the image sensor 100 illustrated in FIG. 3. On the other hand, the image sensors 400 and 500 further include second microlenses 445 and 545 disposed between the first microlenses 440 and 540 and the color filters 430 and 530, respectively. For example, the second microlenses 445 and 545 secondly refract light that has been first refracted while passing through the first microlenses 440 and 540. Light that is secondarily refracted by the image sensors 400 and 500 according to an exemplary embodiment passes through the color filters 430 and 530, and are thirdly refracted to enter substrates 410 and 510.

On the other hand, the diameters of the second microlenses 445 and 545 in the image sensors 400 and 500 are not limited to those illustrated, and the diameters are designed for the incident light to pass through the color filters 430 and 530 and to be incident onto the substrates 410 and 510. For example. as in the second microlens 445 in the image sensor 400 illustrated in FIG. 10, the second microlens 445 shares an optical axis with the first microlens 440. On the other hand, as in the second microlens 545 in the image sensor 500 illustrated in FIG. 11, the second microlens 545 share an optical axis with at least one of the four regions 531 and 532 in the color filter 530.

Referring to FIG. 10, the second microlens 445 in the image sensor 400 according to an exemplary embodiment has a size that corresponds to the first microlens 440. For example, the number of first microlenses 440 and the number of second microlenses 445 are the same. In addition, the curvature of the second microlens 445 is the same as the curvature of the first microlens 440. However, this is only an example and the configuration is not limited thereto, and according to other embodiments, the curvature of the second microlens 445 may be greater or less than the curvature of the first microlens 440.

Referring to FIG. 11, the second microlens 545 in the image sensor 500 according to an exemplary embodiment has a size that corresponds to a size of each of the four regions 531 and 532 in the color filter 530, For example, one pixel area PX corresponds to four second microlenses 545. In addition, the curvature of each of the second microlens 545 is the same as the curvature of each of the four regions 531 and 532 in the color filter 530. However, this is only an example and the configuration is not limited thereto. According to other embodiments, the curvature of each of the second microlens 545 may be greater or less than the curvature of each of the four regions 531 and 532 in the color filter 530.

In exemplary embodiments illustrated in FIGS. 8 to 11, the image sensors 200, 300, 400, and 500 include curved color filters 230, 330, 430 and 530, by way of example, thereby improving performance or yield of the image sensors 200, 300, 400 and 500. However, embodiments of the present inventive concept are not limited thereto, and in the image sensors 200, 300, 400, and 500 according to exemplary embodiments, autofocusing sensitivity loss is significantly reduced using the curved color filters 230, 330, 430 and 530, and other configurations can be variously modified.

Figure 12:
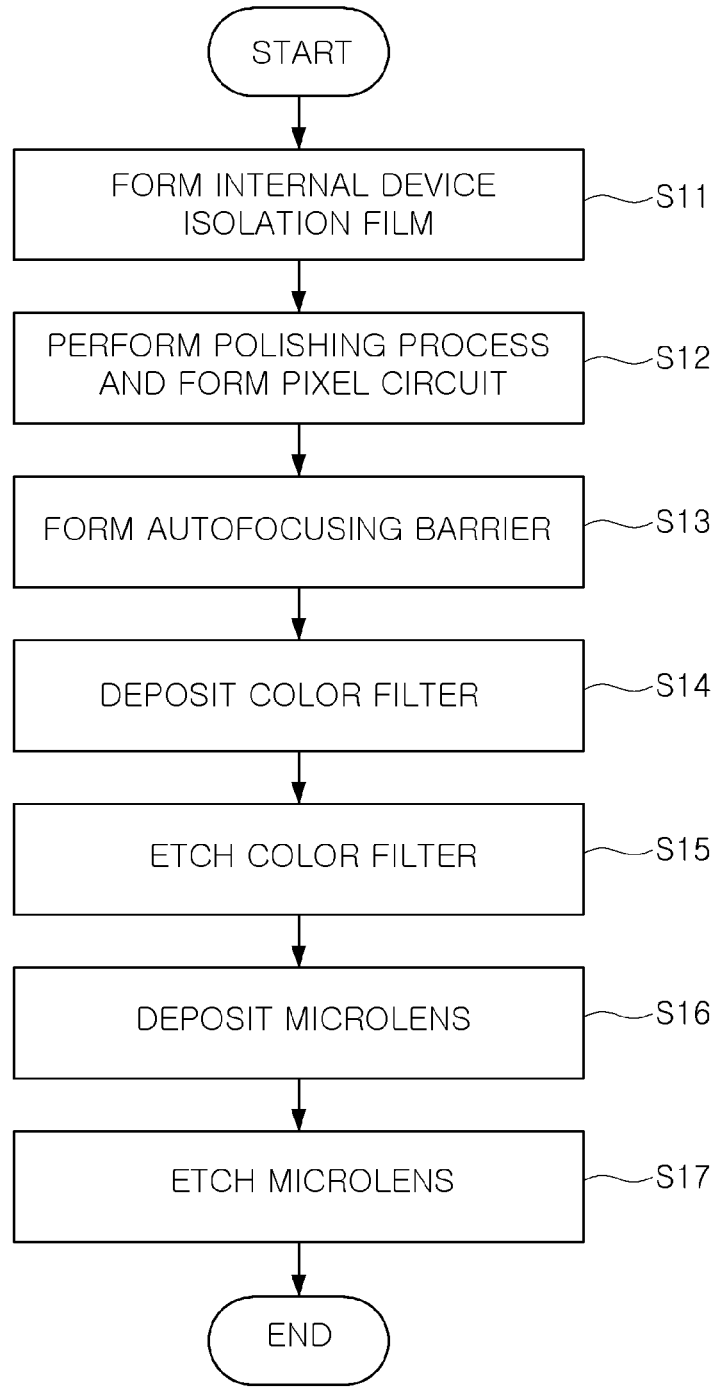
FIG. 12 is a flowchart of a process of manufacturing an image sensor illustrated in FIG. 3, according to an exemplary embodiment.

FIG. 12 is a flowchart of a process of manufacturing an image sensor illustrated in FIG. 3, according to an exemplary embodiment.

Referring to FIG. 12, a method of manufacturing the image sensor 100 illustrated in FIG. 3 according to an exemplary embodiment includes etching a color lens, unlike a manufacturing process of a general image sensor. To manufacture the image sensor 100, first, an internal device isolation film is formed by filling a trench formed in a substrate with an insulating material (S11). For example, the internal device isolation film includes a first device isolation film that separates pixel areas from each other and a second device isolation film that separates photodiodes from each other. For example, the first device isolation film and the second device isolation film are formed at the same time. However, embodiments of the present inventive concept are not limited thereto, and in other embodiments, the first device isolation film and the second device isolation film are formed in separate processes.

In an embodiment, a portion of the substrate is removed through a polishing process, and a pixel circuit that controls the operation of the image sensor 100 is disposed on one surface of the partially removed substrate (S12). in addition, another portion of the substrate is further removed through a polishing process in the opposite direction, and an autofocusing barrier is disposed on the other surface of the partially removed substrate (S13). However, this is only an example, and in other embodiments, as described above, the image sensor does not include an autofocusing barrier. For example, one surface of the substrate is where the internal device isolation film starts to be formed, and the internal device isolation film extends toward the other surface of the substrate.

In an embodiment, a color filter that extracts a light component having a predetermined wavelength is formed on the other surface of the substrate (S14). The color filter is formed by a deposition process, and the color filter is divided by an autofocusing barrier. However, embodiments of the present inventive concept are not limited thereto, and in other embodiments, when there is no autofocusing barrier, color filters of different colors can be formed, based on a direction in which the first device isolation film extends as a boundary. In addition, the color of the color filter also varies depending on exemplary embodiments.

In an embodiment, thee color filter is initially formed to have a flat upper surface in directions parallel to the upper surface of the substrate, and is subsequently etched to have a convex upper surface that refracts incident light (S15), For example, the color filter includes regions that correspond to respective photodiodes, and each region has a convex upper surface. However, this is only an example, and in other embodiments, the shape of the curved color filter is modified.

In an embodiment, a microlens is deposited on the upper surface of the color filter (S16), and the deposited microlens is etched to refract incident light (S17). The shape of the etched microlens is not limited to a particular shape, and can be variously changed in other embodiments. However, the microlens corresponds to one pixel area that includes four photodiodes. The image sensor 100 can be manufactured by the operations S11 to S17, and a detailed form of the image sensor 100 in each operation will be described below.

FIGS. 13A to 13H are cross-sectional views that illustrate a process of manufacturing an image sensor illustrated in FIG. 3, according to an exemplary embodiment.

Figure 13A:
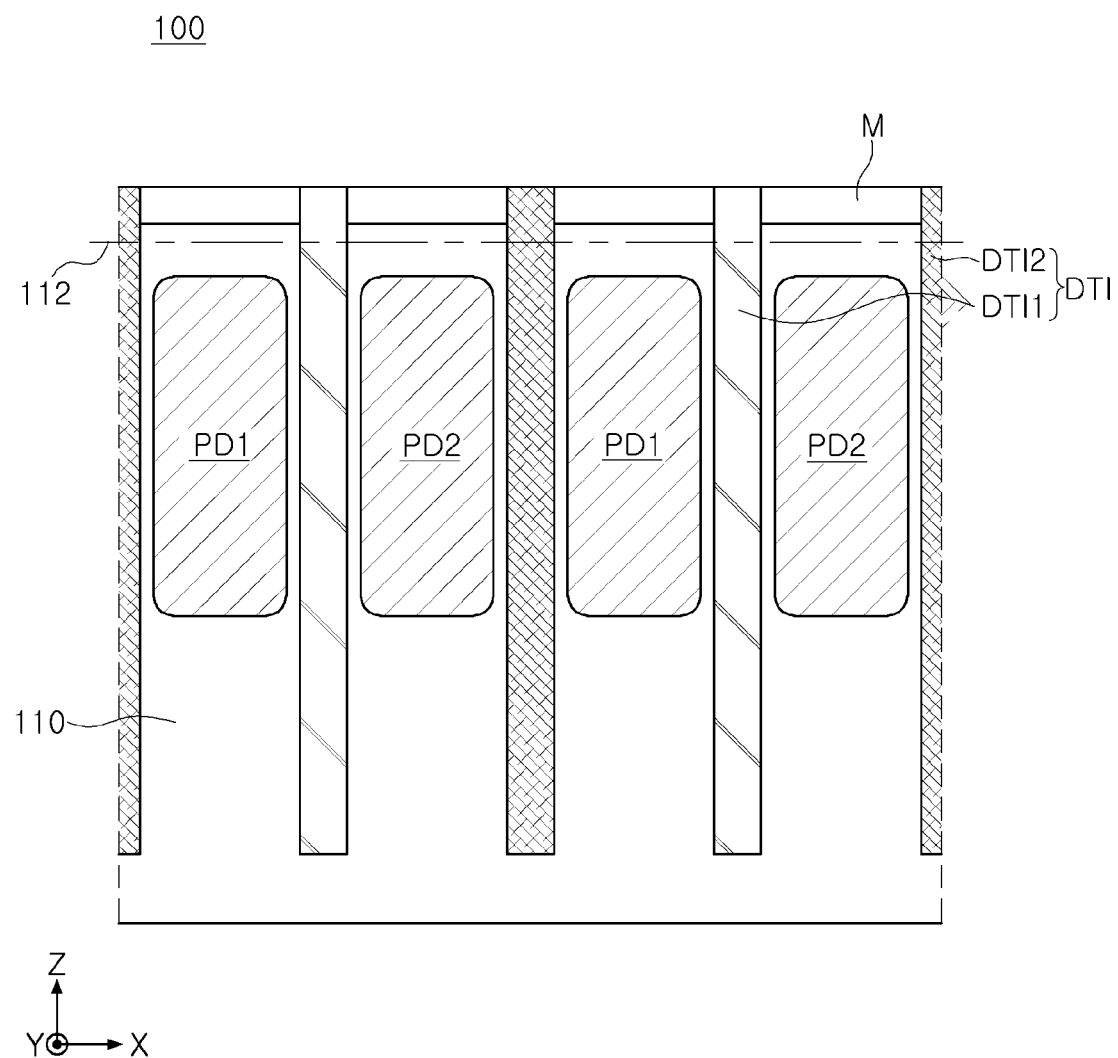
FIGS. 13A to 13H are cross-sectional views that illustrate a process of manufacturing an image sensor illustrated in FIG. 3, according to an exemplary embodiment.

FIGS. 13A. to 13H are cross-sectional views that illustrate a step-by-step manufacturing process of the image sensor 100 according to an exemplary embodiment described in FIG. 12. First, FIG. 13A is a cross-sectional view of the image sensor 100 in operation S11 in which internal device isolation films DTI1 and DTI2 of device isolation film DTI are formed in trenches on the substrate 110. For example, to form a trench in a space in which the internal device isolation film DTI is to be formed, a mask layer M is stacked on one surface of the substrate 110. For example, a trench is not formed in a space covered by the mask layer M, and an insulating material fills the inside of a trench formed in a space not covered by the mask layer M o form the internal device isolation film DTI. The mask layer M is removed together with portions of the substrate 110 and the internal device isolation film DTI by a polishing process. For example, the upper surface of the substrate 110 that remains after portions are removed by the polishing process is the second surface 112.

Figure 13B:
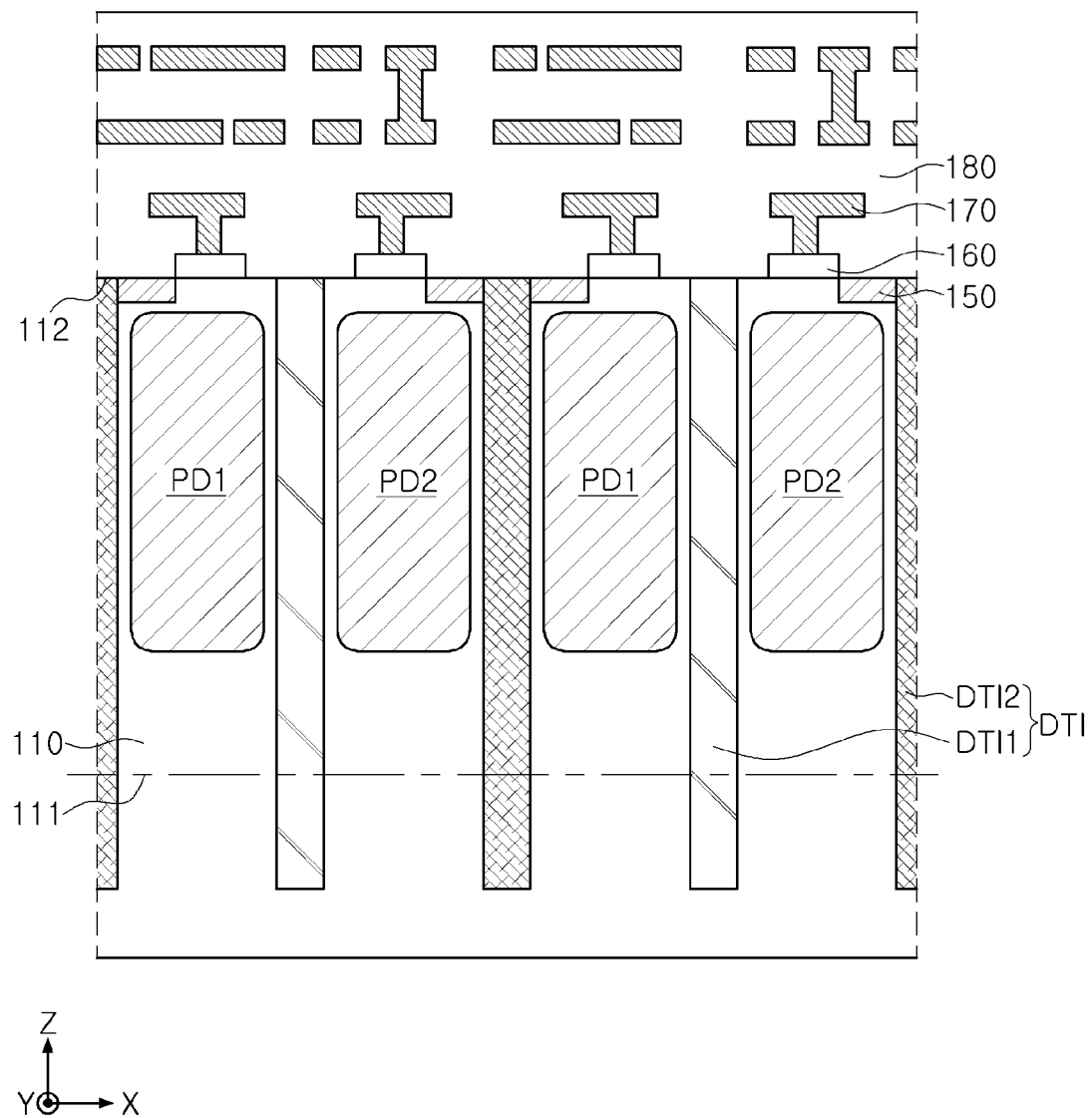

Referring to FIG. 13B, in an embodiment, a pixel circuit is disposed on the second surface 112 that remains after the polishing process is performed in the image sensor 100. As described above, the pixel circuit includes the plurality of elements 160, the wiring patterns 170 connected to the plurality of elements 160, an insulating layer 180 that covers the plurality of elements 160 and the wiring patterns 170, a floating diffusion region 150, etc. The pixel circuit controls the operation of the image sensor 100. On the other hand, portions of the substrate 110 and the internal device isolation film DT1 on the opposite side of the second surface 112 of the substrate 110 are removed by a polishing process. For example, the opposite upper surface of the substrate 110 that remains after portions are removed by the polishing process is the first surface 111. Therefore, an internal structure and a pixel circuit of the substrate 110 of the image sensor 100 can be manufactured.

Figure 13C:
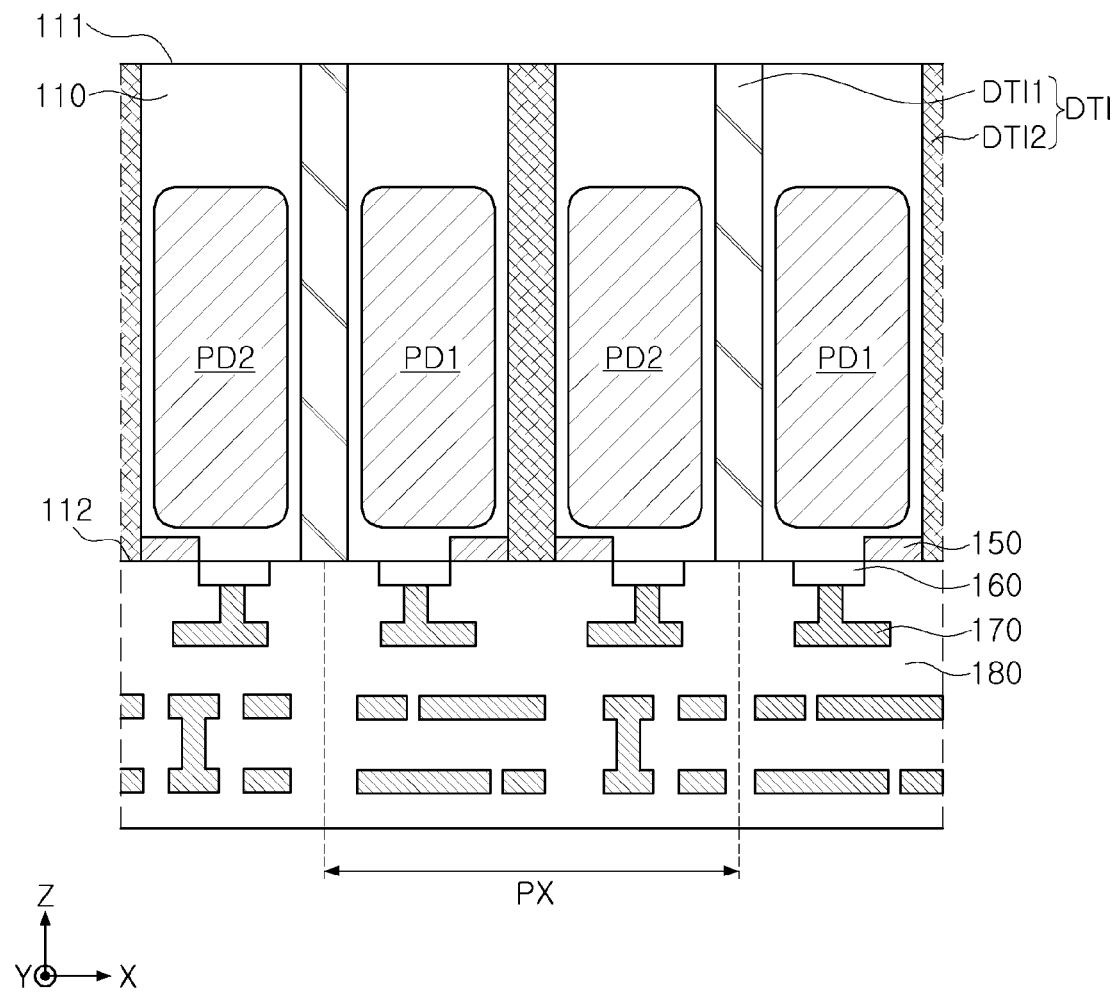
Figure 13D:
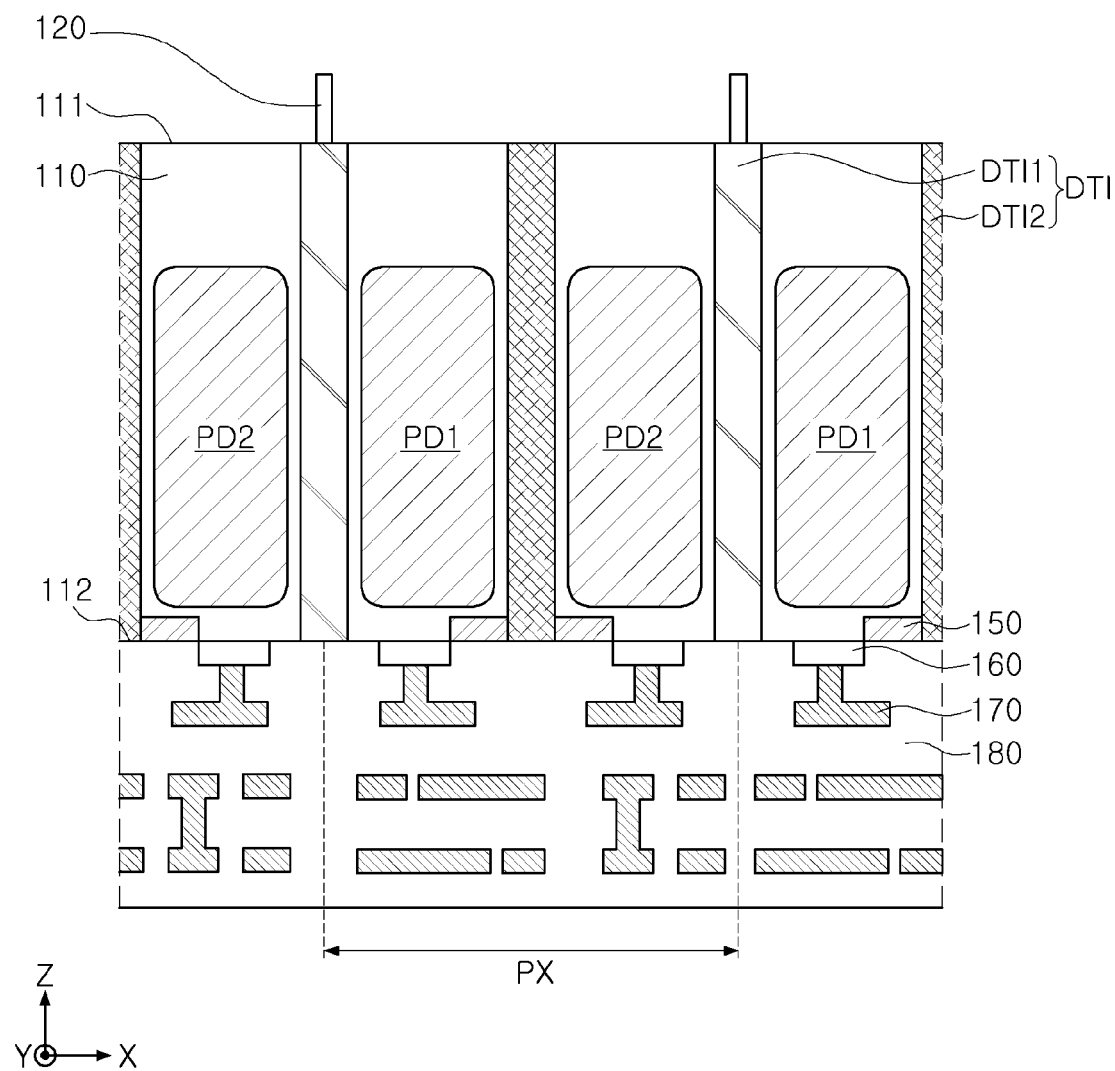
Figure 13E:
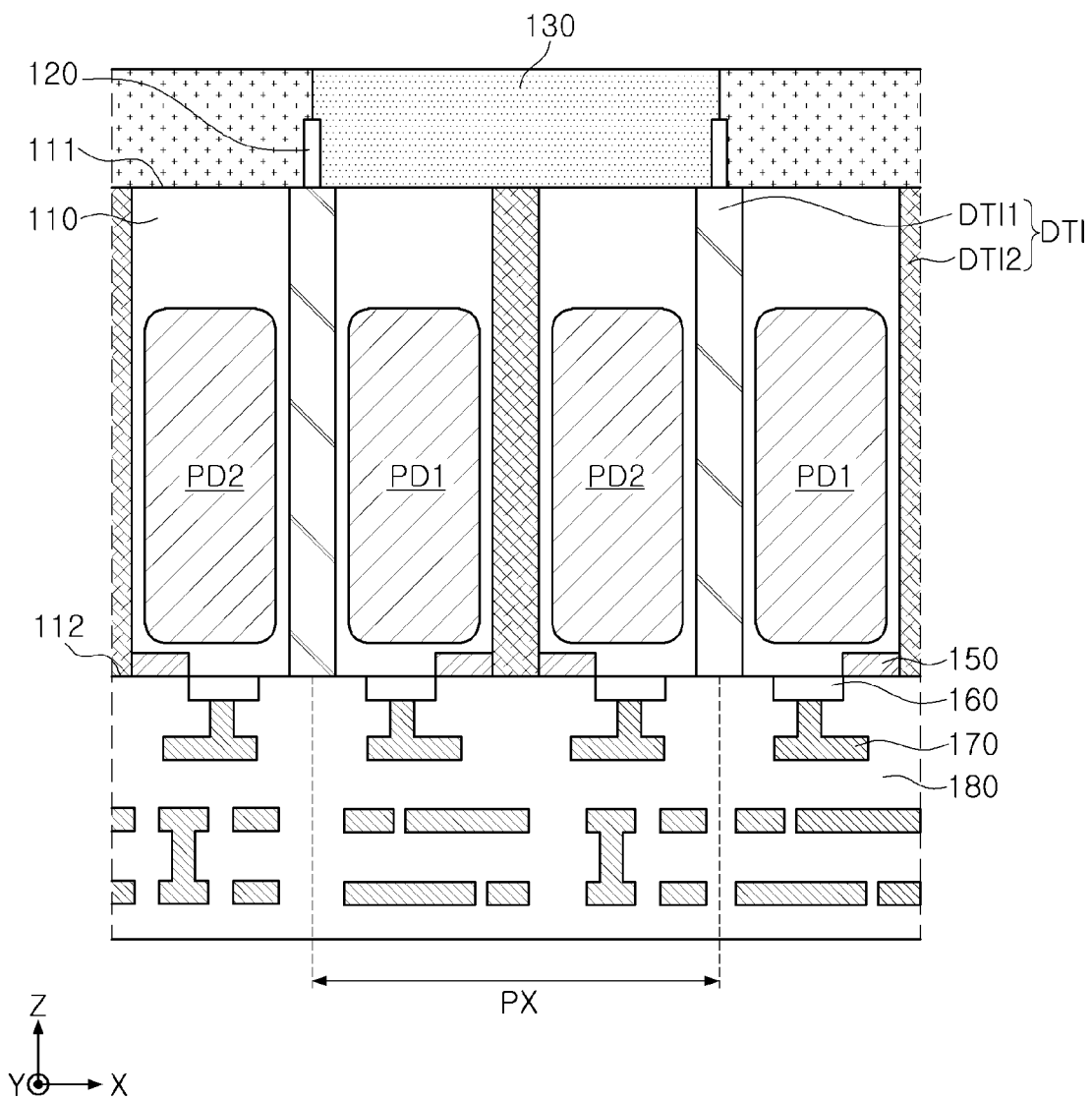
Figure 13F:
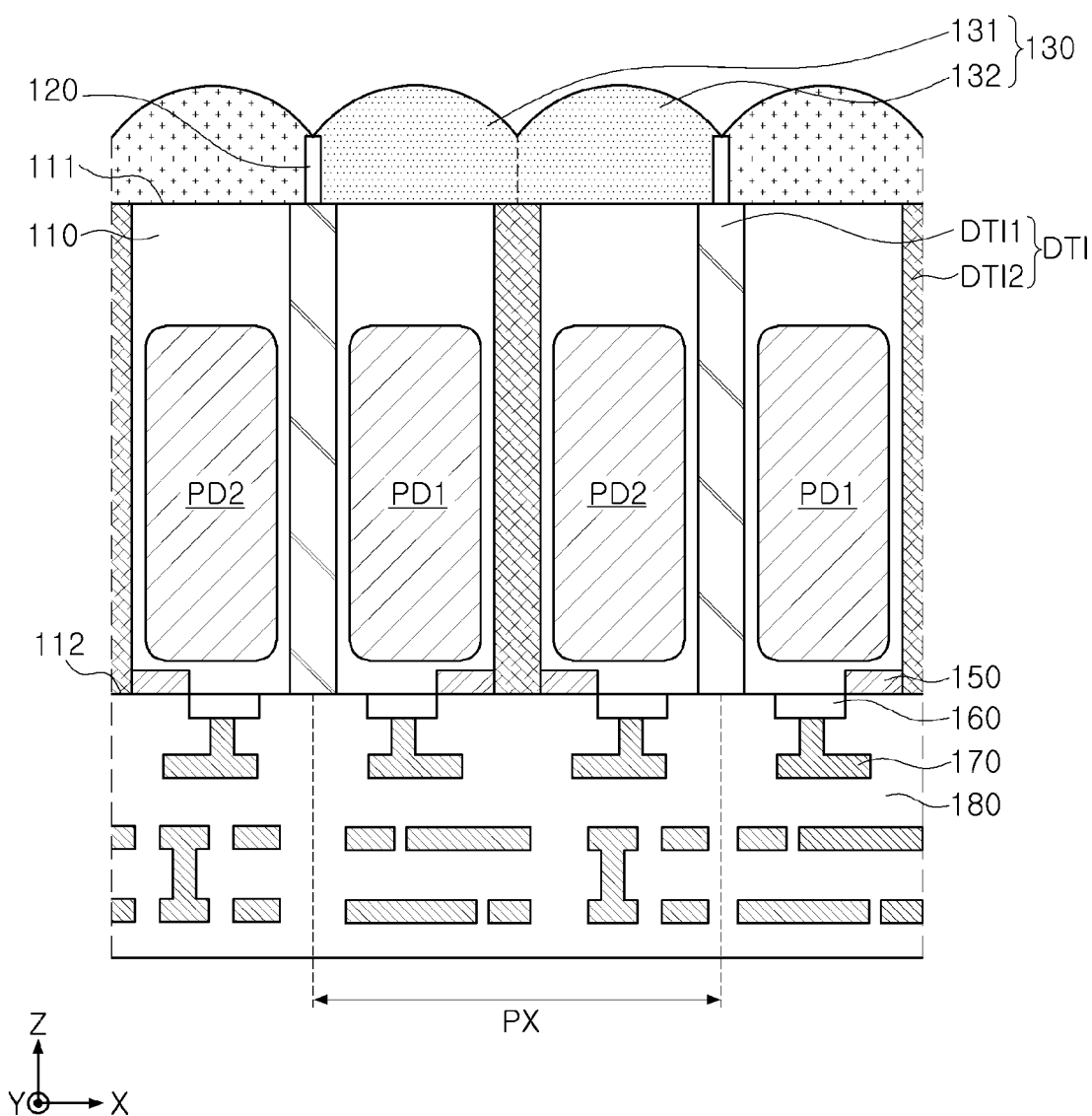
Figure 13G:
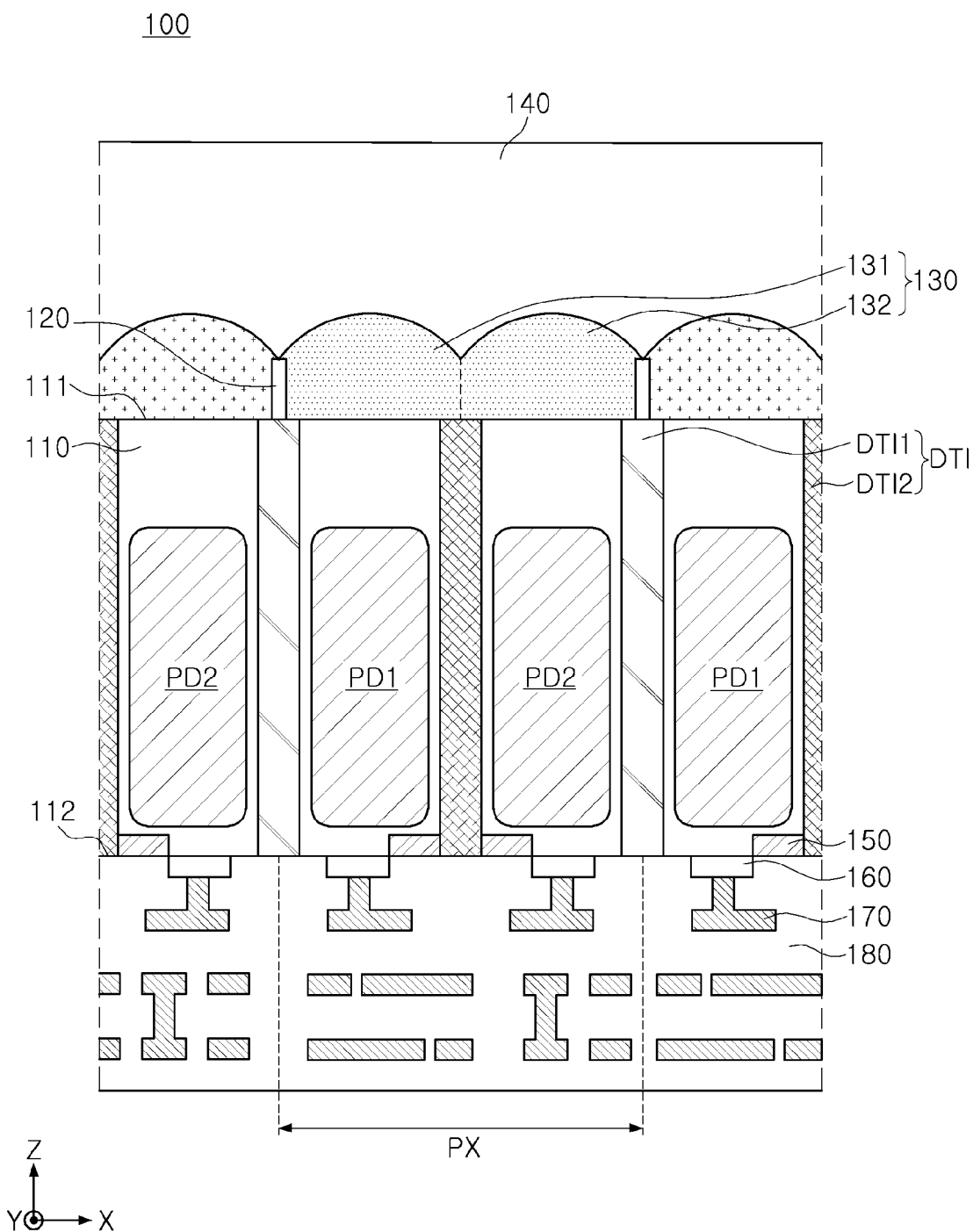
Figure 13H:
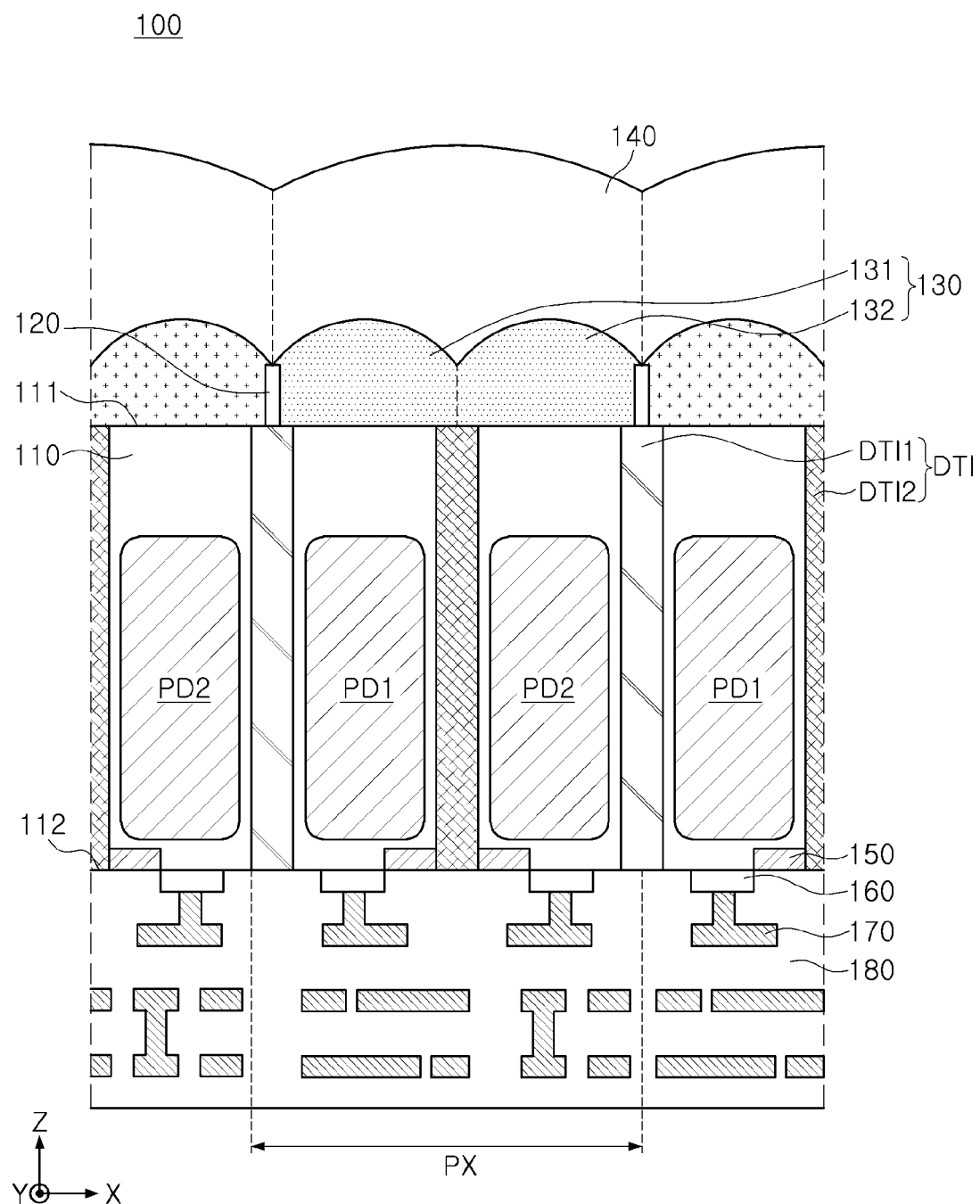

Referring to FIG. 13C, in an embodiment, the first device isolation film DTI1 and the second device isolation film DTI2 in the image sensor 100 are connected to the second surface 112 and the first surface 111 of the substrate 110. However, this is only an example and embodiments are not limited to the illustrated configuration. In other embodiments, the first device isolation film DTI1 and the second device isolation film DTI2 have different lengths. In detail, extension lengths of the first device isolation film DTI1 and the second device isolation film DTI2 differ from each other.

In an embodiment, the first device isolation film DTI1 and the second device isolation film DTI2 extend from the second surface 112 of the substrate 110 toward the first surface 111, The first device isolation film DTI1 and the second device isolation film DTI2 extend in different directions. The internal device isolation film DTI that extends from the second surface 112 toward the first surface 111 includes polysilicon, and the internal device isolation film DTI that extends from the first surface 111 toward the second surface 112 includes a metal. When light is incident, polysilicon has a higher absorption rate than metal. Accordingly, when the image sensor 100 according to an exemplary embodiment includes the internal device isolation film DTI that includes polysilicon and extends from the second surface 112 toward the first surface 111, the improvement of the autofocusing sensitivity is enhanced. However, embodiments of the present in concept are not limited thereto, and other embodiments can incorporate the image sensor 100 that includes the internal device isolation film DTI that includes metal and extends from the first surface 111 toward the second surface 112.

Referring to FIGS. 13D to 13H, in an embodiment, a manufacturing process of the image sensor 100 in steps S13 to S17 of FIG. 12 is illustrated. For example, the autofocusing barrier 120 is formed on the, second surface 112 of the substrate 110, the color filter 130 is deposited, and the color filter 130 is etched to form the convex upper surfaces. Subsequently, a first mice lens 140 that collects incident light is deposited on the upper surface of the curved color filter 130, and the first microlens 140 undergoes an etching process to form the convex upper surfaces, thereby it manufacturing the image sensor 100 as illustrated in FIG. 3. However, this is only an example and embodiments are not limited to this configuration. in other embodiments, a manufacturing process can vary depending on the configuration and effect of the image sensor 100.

Figure 14:
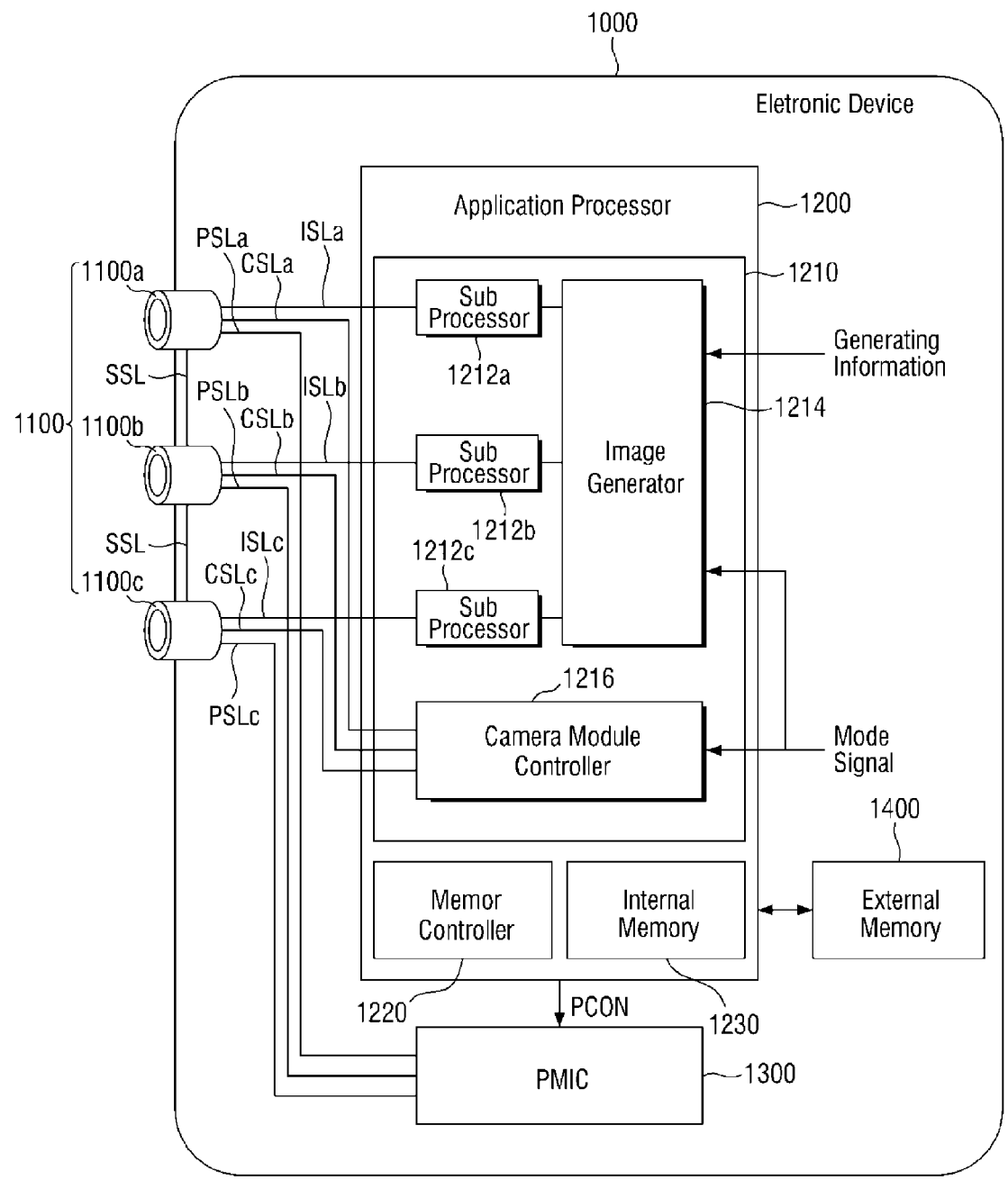
FIGS. 14 and 15 schematically illustrate an electronic device that includes an image sensor according to an exemplary embodiment.
Figure 15:
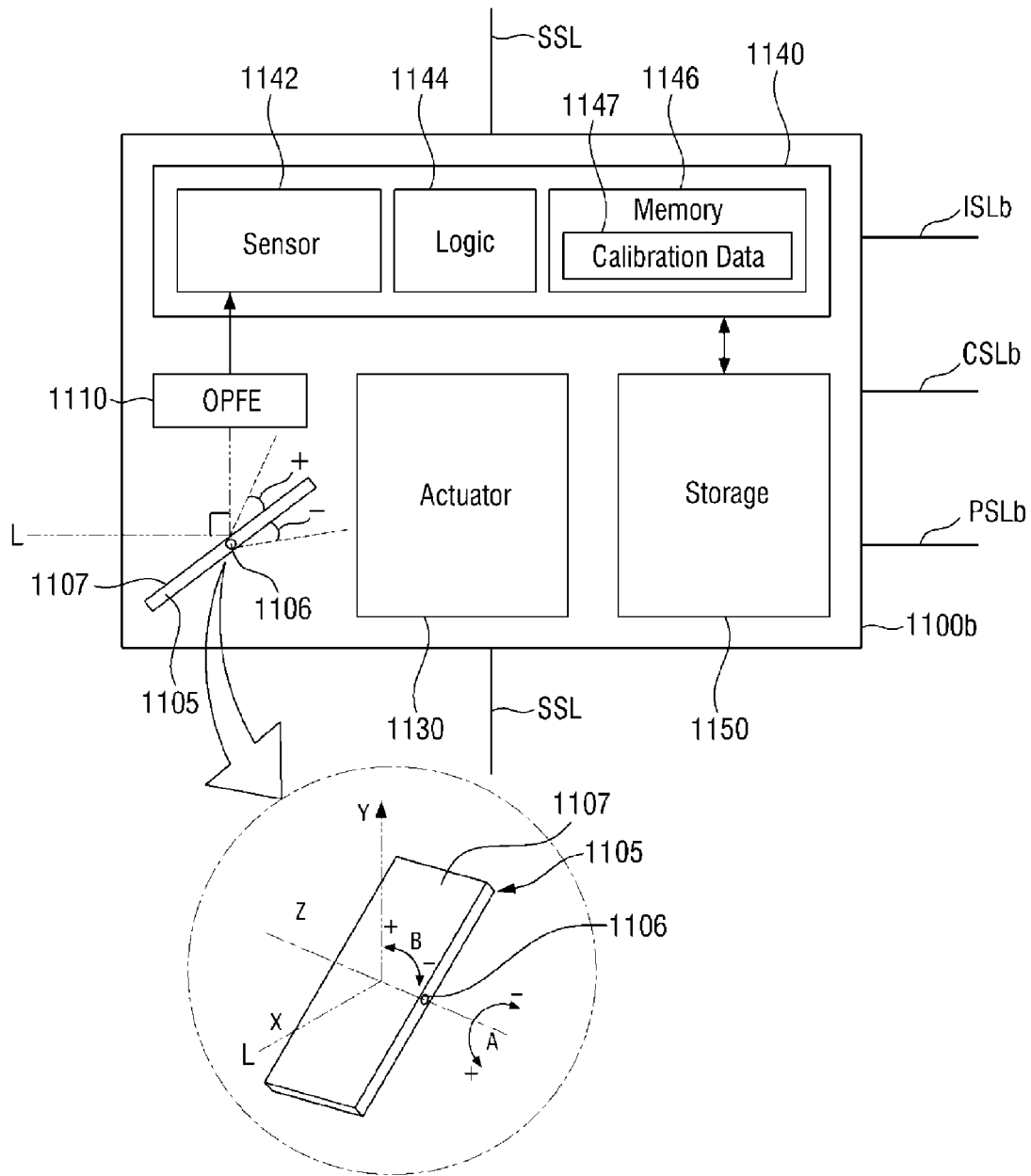

FIGS. 14 and 15 schematically illustrate an electronic device that includes an image sensor according to an exemplary embodiment.

Referring to FIG. 14, in an embodiment, an electronic device 1000 includes a camera module group 1100, an application processor 1200, a power management integrated circuit (PMIC) 1300, and an external memory 1400.

In an embodiment, the camera module group 1100 includes a plurality of camera modules 1100a, 1100b, and 1100c. Although the drawing shows an embodiment that includes three camera modules 1100a, 1100b, and 1100c, embodiments are not limited thereto. In some embodiments, the camera module group 1100 includes only two camera modules, and in other embodiments, the camera module group 1100 includes n camera modules, where n is a natural number of 4 or more. In addition, in an embodiment, at least one of the plurality of camera modules 1100a, 1100b, and 1100c in the camera module group 1100 includes an image sensor according to an exemplary embodiment described above with reference to FIGS. 1 to 13H.

Hereinafter, a detailed configuration of the camera module 1100 will be described with reference to FIG. 15, but the following description also equally applies to the other camera modules 1100a and 1100b l , according to an exemplary embodiment.

Referring to FIG. 15, in an embodiment, the camera module 1100b includes a prism 1105, an optical path folding element 1110, hereinafter referred to as "OPFE", an actuator 1130, an image sensing device 1140, and a storage device 1150.

In an embodiment, the prism 1105 changes the path of externally incident light L and includes a reflective surface 1107 of light reflecting material.

In some embodiments, the prism 1105 changes the path of light L incident in a first direction X to a second direction Y perpendicular to the tint direction X. In addition, the prism 1105 rotates the reflective surface 1107 of the light reflective material in the direction A around the central axis 1106, or rotates in the direction B to change the path of the incident light L to the vertical second direction Y. in addition. the OPFF 1110 can also move in a third direction Z perpendicular to the first direction. X and the second direction Y.

In some embodiments, as illustrated, the maximum rotation angle of the prism 1105 in the A direction is less than 15 degrees in the positive (+) A direction, and may be greater than 15 degrees in the negative (−) A direction. However, embodiments are not limited thereto.

In some embodiments, the prism 1105 rotates between 20 degrees in the plus (+) or minus (−) B direction, or between 10 degrees and 20 degrees, or between 15 degrees and 20 degrees, where the angle of movement is positive. The prism 105 may rotate at the same angle in the (+) or minus (−) B direction, or it may rotate to almost the same angle in the range of around 1 degree.

In some embodiments, the prism 1105 moves the reflective surface 1107 in a third direction, such as the Z direction, parallel to the extension direction of the central axis 1106.

In some embodiments, the OPFE 1110 includes, for example, an optical lens that includes m groups, where m is a natural number. The m lenses cart move in the second direction Y to change the optical zoom ratio of the camera module 1100*b*. For example, if the basic optical zoom magnification of the camera module 1100*b* is Z, then moving the m optical lenses in the OPFE 1110 changes the optical zoom magnification of the camera module 1100*b* to, e.g., 3Z or 5Z, or changes the optical zoom magnification to be 5Z or higher.

In some embodiments, the actuator 1130 moves the OPFE 1110 or an optical lens, hereinafter referred to as an optical lens, to a specific position. For example, the actuator 1130 adjusts the position of the optical lens so that an image sensor 1142 of the image sensing device 1140 is positioned at a focal length of the optical lens for accurate sensing.

In some embodiments, the image sensing device 1140 includes the image sensor 1142, a control logic 1144, and a memory 1146. The image sensor 1142 senses an image of a sensing target using light L received through the optical lens. The control logic 1144 controls the overall operation of the camera module 1100*b*. For example, he control logic 1144 controls the operation of the camera module 1100*b* according to a control signal received, through a control signal line CSLb.

In some embodiments, the memory 1146 stores information for the operation of the camera module 1100*b*, such as calibration data 1147. The calibration data 1147 includes information for the camera module 1100*b* to generate image data using light L received from the outside. The calibration data 1147 includes, for example, information on a degree of rotation described above, information on a focal length, information on an optical axis, etc. When the camera module 1100*b* is implemented in the form of a multi-state camera whose focal length changes according to the position of the optical lens, the calibration data 1147 includes the focal length values for each position or state of the optical lens and information related to autofocusing.

In some embodiments, the storage unit 1150 stores image data sensed through the image sensor 1142. The storage unit 1150 is disposed outside of the image sensing device 1140 and is stacked with a sensor chip that constitutes the image sensing device 1140. In some embodiments, the storage unit 1150 is implemented as an Electrically Erasable Programmable Read-Only Memory (EEPROM), but embodiments are not limited thereto.

Referring to FIGS. 14 and 15 together, in some embodiments, each of the plurality of camera modules 1100*a*, 1100*b*, and 1100*c* include a an actuator 1130. Accordingly, each of the plurality of camera modules 1100*a*, 1100*b*, and 1100*c* may include the same or different calibration data 1147 according to the operation of the actuator 1130 included therein.

In some embodiments, one of the plurality of camera modules 1100*a*, 1100*b* and 1100*c*, such as 1100*b*, is a folded lens-type camera module that includes the prism 1105 and OPFE 1110 described above, and the remaining camera modules, such as 1100*a* and 1100*c*, are vertical type camera modules that do not include the prism 1105 and the OPFE 1110, but embodiments are not limited thereto.

In some embodiments, one of the plurality of camera modules 1100*a*, 1100*b* and 1100*c*, such as camera module 1100*c*, is a vertical type camera module that extracts depth information using, for example, infrared (IR) light, and is a type of depth camera. in this case, the application processor 1200 merges the image data received from the depth camera and the image data received from another camera module, such as camera module 1100*a* or 1100*b*, to generate a 3D depth image.

In a some embodiments, at least two of the plurality of camera modules 1100*a*, 1100*b*, and 1100*c*, such as camera modules 1100*a* and 1100*b*, have different fields of view (view fields). In this case, for example, the optical lenses of at least two of the plurality of camera modules 1100*a*, 1100*b*, and 1100*c*, such as camera modules 1100*a* and 1100*b*, are different from each other, but embodiments are not limited thereto.

In addition, in some embodiments, viewing angles of each of the plurality of camera modules 1100*a*, 1100*b*, and 1100*c* differ from each other. In this case, the optical lenses in each of the plurality of camera modules 1100*a*, 1100*b*, and 1100*c* are different from each other, but embodiments of the present disclosure are not limited thereto.

In some embodiments, each of the plurality of camera modules 1100*a*, 1100*b*, and 1100*c* are physically separated from each other. For example, the sensing area of one image sensor 1142 is not divided and shared by the plurality of camera modules 1100*a*, 1100*b*, and 1100*c*. Rather, an independent image sensor 1142 is disposed inside each of the plurality of respective camera modules 1100*a*, 1100*b*, and 1100*c*.

Referring back to FIG. 14, in some embodiments, the application processor 1200 includes an image processing device 1210, a memory controller 1220, and an internal memory 1230. The application processor 1200 is implemented separately from the plurality of camera modules 1100*a*, 1100*b*, and 1100*c*. For example, the application processor 1200 and the plurality of camera modules 1100*a*, 1100*b*, and 1100*c* are separated from each other as separate semiconductor chips.

In some embodiments, the image processing apparatus 1210 includes a plurality of sub-image processors 1212*a*, 1212*b*, and 1212*c*, an image generator 1214, and a camera module controller 1216.

In some embodiments, the plurality of sub-image processors 1212*a*, 1212*b*, and 1212*c* correspond to the number of the plurality of camera modules 1100*a*, 1100*b*, and 1100*c*, and each sub-image processors 1212*a*, 1212*b*, and 1212*c* corresponds to a respective camera module 1100*a*, 1100*b*, and 1100*c*.

In some embodiments, image data generated from each of the camera modules 1100*a*, 1100*b*, and 1100*c* is provided to the corresponding sub-image processors 1212*a*, 1212*b*, and 1212*c* through separate image signal lines ISLa, ISLb, and ISLc, respectively. For example, image data generated from the camera module 1100*a* is provided to the sub-image processor 1212*a* through image signal line ISLa, and the image data generated from the camera module 1100*b* is provided to the sub-image processor 1212*a* through image signal line ISLb. The image data generated from the camera module 1100*c* is provided to the sub-image processor 1212*c* through image signal line ISLc. Such image data transmission is performed using, for example, a camera serial interface (CSI) based on a Mobile Industry Processor Interface (MIPI), but embodiments are not limited thereto.

On the other hand, in some embodiments, one sub-image processor is arranged to correspond to a plurality of camera modules. For example, the sub image processor 1212a and the sub image processor 1212c are not implemented separately from each other as illustrated, but are integrated into one sub image processor. The image data provided from the camera module 1100a and the camera module 1100c may be selected through a selection element, such as a multiplexer, etc, and then provided to an integrated sub-image processor.

In some embodiments, image data provided to each of the sub-image processors 1212a, 1212b, and 1212c is provided to the image generator 1214. The image generator 1214 generates an output image using image data received from each of the sub-image processors 1212a, 1211b, and 1212c according to image generating information or a mode signal.

Specifically, in some embodiments, the image generator 1214 merges at least some of the image data received from the camera modules 1100a, 1100b, and 1100c, which have different viewing angles, according to the image generation information or the mode signal to generate an output image. On the other hand, the image generator 1214 may generate an output image by selecting image data generated from one of the camera modules 1100a, 1100b, and 1100c according to the image generation information or the mode signal.

In some embodiments, the image generation information includes a zoom signal or a zoom factor. Further, in some embodiments, the mode signal is, for example, a signal based on a mode selected by a user.

In some embodiments, when the image generation information is a zoom signal or zoom factor, and each camera module 1100a, 1100b, 1100c has a different viewing field or viewing angle, the image generator 1214 operates differently according to the type of the zoom signal. For example, when the zoom signal is a first signal, then, after merging the image data received from two camera modules, such as camera module 1100a and camera module 1100c, an output image is generated by the merged image signal and the image data output from the camera module not used for merging an output image, in this case camera module (1100b). If the zoom signal is a second signal different from the first signal, the image generator 1214 does not perform such image data merging, and converts image data received from any one of the camera module 1100a, 1100b, 1100c, to create an output image. However, embodiments are not limited thereto, and in other embodiments, a method of processing image data can be modified and implemented as needed.

In some embodiments, the image generator 1214 receives high dynamic range (HDR) image data that has a different exposure time from at least one of the plurality of sub-image processors 1212a, 1212b, and 1212c, and generates merged image data with an increased dynamic range.

In some embodiments, the camera module controller 1216 provides a control signal to each of the camera modules 1100a, 1100b, and 1100c, The control signal generated from the camera module controller 1216 is transmitted to the corresponding camera modules 1100a, 1100b, and 1100c through separate control signal lines CS1a, CS1b, and CSLc, respectively, In some embodiments, any one of the plurality of camera modules 1100a, 1100b, 1100c can be designated as a master camera, such as camera module 1100b, according to the image generation information which includes a zoom signal, or the mode signal, and the remaining camera modules (such as camera modules 1100a and 1100c are designated as slave cameras. Such information is included in the control signal and transmitted to the corresponding camera modules 1100a, 1100b, and 1100c through the respective control signal lines CSLa, CSLb, and CSLc.

In an embodiment, the selection of camera modules that operate as masters and slaves can be changed according to the zoom factor or the operation mode signal. For example, when the viewing angle of the camera module 1100a is wider than that of the camera module 1100b and the zoom factor shows a low zoom magnification, the camera module 1100b operates as a master, and the camera module 1100a is a slave. Conversely, when the zoom factor indicates a high zoom magnification, the camera module 1100a operates as a master and the camera module 1100b operates as a slave.

In some embodiments, a control signal provided from the camera module controller 1216 to each of the camera modules 1100a, 1100b, and 1100c includes a sync enable signal. For example, when the camera module 1100b is a master camera and the camera modules 1100a and 1100c are slave cameras, the camera module controller 1216 transmits a sync enable signal to the camera module 1100b. The camera module 1100b that receives the sync enable signal generates a sync signal based on the received sync enable signal, and transmits the generated sync signal to the camera modules 1100a and 1100c . The camera module 1100b and the camera modules 1100a and 1100c are synchronized by the sync signal to transmit image data to the application processor 1200.

In some embodiments, the control signal provided from the camera module controller 1216 to the plurality of camera modules 1100a, 1100b, and 1100c includes mode information according to the mode signal. Based on this mode information, the plurality of camera modules 1100a, 1100b, and 1100c can operate in a first operation mode or a second operation mode, depending on the sensing speed.

In some embodiments, in the first operation mode, the plurality of camera modules 1100a, 1100b, and 1100c generate an image signal at a first rate, such as a first frame rate, and encode the image signal at a second rate that is higher than the first rate, and transmit the encoded image signal to the application processor 1200. In this case, the second speed may be 30 times or greater than the first speed.

In some embodiments, the application processor 1200 stores the received image signal, for example, the encoded image signal, in the memory 1230 provided therein or the external storage 1400, and then, the encoded image signal is read from the memory 1230 or the storage 1400 and decoded, and the image data generated from the decoded image signal is displayed. For example, a corresponding subprocessor of the plurality of subprocessors 1212a, 1212b, and 1212c performs decoding and performs image processing on the decoded image signal.

In some embodiments, in the second operation mode, the plurality of camera modules 1100a, 1100b, and 1100c generate an image signal at a third frame rate that is lower than the first frame rate and transmits the image signal to the application processor 1200. The image signal provided to the application processor 1200 is an unencoded signal. The application processor 1200 may perform image processing on the received image signal, or may store the image signal in the memory 1230 or the storage 1400.

In some embodiments, the PMIC 1300 supplies power, such as a power voltage, to each of the plurality of camera modules 1100a, 1100b, and 1100c. For example, the PMIC 1300, under the control of the application processor 1200, supplies a first power to the camera module 1100a through the power signal line PSLa, supplies a second power to the camera module 1100b through the power signal line PSLb, and supplies a third power to the camera module 1100c through the power signal line PSLc.

In some embodiments, the PMIC 1300 generates power for each of the plurality of camera modules 1100a, 1100b, and 1100c in response to a power control signal PCON received from the application processor 1200, and also adjusts the power level. The power control signal PCON includes a power adjustment signal for each operation mode of the plurality of camera modules 1100a, 1100b, and 1100c. For example, the operation mode includes a low power mode, and in this case, the power control signal PCON includes information on a camera module that operates in a low power mode and a set power level. Levels of power signals provided to each of the plurality of camera modules 1100a, 1100b, and 1100c may be the same or different from each other. In addition, the level of power signals can be dynamically changed.

As set forth above, an image sensor according to an exemplary embodiment includes a color filter that has convex upper surfaces for respective pixel areas. On the other hand, light that is refracted and incident through a microlens passes through the color filter and is refracted again to enter the substrate. Accordingly, loss of autofocusing sensitivity according to the structure of an internal device isolation film is reduced.

While exemplary embodiments have been illustrated and described above, it will be apparent to those skilled in the art that modifications and variations could be made without departing from the scope of embodiments of the present invective concept as defined by the appended claims.

What is claimed is:

1. An image sensor, comprising:
    a substrate that includes a first surface and a second surface that oppose each other in a first direction, and a plurality of pixel areas arranged in directions parallel to the first surface;
    a first device isolation film that separates each of the plurality of pixel areas;
    four photodiodes disposed in each of the plurality of pixel areas inside of the substrate, and arranged in 2×2 array in directions parallel to the first surface;
    a second device isolation film that separates the four photodiodes from each other;
    a color filter disposed on the first surface of the substrate, wherein the color filter includes four regions that correspond to the four photodiodes, respectively, wherein each of the four regions has a convex upper surface; and
    a first microlens disposed above the color filter and that corresponds to each of the plurality of pixel areas, wherein the first microlens has a convex upper surface and a concave lower surface whose curvature conforms to a curvature of an upper surface of a layer below the first microlens,
    wherein, in a direction parallel to the direction in which the pixel areas are arranged, a first length of the first microlens is twice a diameter of the circular convex upper surface of each of the four regions, and
    wherein in a direction that is diagonal to the direction in which the pixel areas arranged, a second length of the first microlens is greater than twice the diameter of a circular convex upper surface of each of the four regions.

2. The image sensor of claim 1, wherein the first microlens and the four regions included in the color filter each have different optical axes.

3. The image sensor of claim 2, wherein an optical axis of the first microlens overlaps the second device isolation film in the first direction.

4. The image sensor of claim 2, wherein the optical axes of the four regions overlap the four photodiodes in the first direction, respectively.

5. The image sensor of claim 1, wherein the color filter includes an autofocusing barrier disposed at a portion of a boundary of the four regions.

6. The image sensor of claim 1, wherein the color filter includes an autofocusing barrier disposed on an upper surface of the first device isolation film.

7. The image sensor of claim 1, wherein a curvature of the upper surface of the first microlens is less than a curvature of each of the four regions included in the color filter, and a curvature of the lower surface of the first microlens is equal to a curvature of each of the four regions included in the color filter.

8. The image sensor of claim 1, further comprising a second microlens disposed between the first microlens and the color filter.

9. The image sensor of claim 8, wherein the second microlens shares an optical axis with the first microlens.

10. The image sensor of claim 8, wherein the second microlens shares an optical axis with at least one of the four regions in the color filter.

11. The image sensor of claim 8, wherein a curvature of an upper surface of the second microlens is equal to a curvature of the upper surface of the first microlens.

12. The image sensor of claim 8, wherein a curvature of an upper surface of the second microlens is equal to a curvature of at least one of the four regions in the color filter.

13. The image sensor of claim 1, wherein the first device isolation film and the second device isolation film extend from the second surface toward the first surface, and are connected to the first surface and the second surface.

14. The image sensor of claim 13, wherein a thickness of the second device isolation film in a second direction perpendicular to the first direction is less than a thickness of the first device isolation film.

15. The image sensor of claim 1, wherein the first device isolation film and the second device isolation film have different lengths in the first direction.

16. The image sensor of claim 1, wherein the first microlens has a rectangular shape with rounded corners, in a plan view.

17. An image sensor, comprising:
    a pixel array that includes a plurality of pixel groups arranged in directions parallel to an upper surface of a substrate, wherein each of the plurality of pixel groups includes a plurality of pixel areas; and
    a logic circuit that obtains a pixel signal from each of the plurality of pixel areas,
    wherein each of the plurality of pixel areas includes four photodiodes arranged in a 2×2 array in directions parallel to the upper surface of the substrate, a color filter disposed on the upper surface of the substrate, and a microlens disposed above the color filter, and
    the color filter has a same color for each of the plurality of pixel areas, and includes four regions that respectively correspond to each of the four photodiodes, wherein each of the four regions has a convex upper surface,
    wherein the microlens has a convex upper surface and a concave lower surface whose curvature conforms to a curvature of an upper surface of a layer below the microlens, and wherein, in a direction parallel to the direction in which the pixel groups are arranged, a first length of the first microlens is twice a diameter of the circular convex upper surface of each of the four regions, and wherein in a direction that is diagonal to the direction in which the pixel groups arranged, a second length of the first microlens is greater than twice the diameter of a circular convex upper surface of each of the four regions.

18. The image sensor of claim 17, wherein each of the plurality of pixel groups includes 4 or 9 pixel areas.

19. The image sensor of claim 17, wherein at least one of the pixel areas includes an autofocusing pixel area and a general pixel area, wherein the microlens is disposed above the color filter of pixels in the autofocusing pixel area, and no microlens is disposed above the color filter of pixels in the general pixel area.

20. An image sensor, comprising:
a substrate;
a first device isolation film that separates pixel areas disposed in directions parallel to an upper surface of the substrate;
four photodiodes disposed in each of the pixel areas inside of the substrate and arranged in a 2×2 array in directions parallel to the upper surface of the substrate;
a second device isolation film that separates the four photodiodes from each other;
a first microlens disposed above the substrate and that corresponds to each of the pixel areas, wherein the first microlens primarily refracts incident light, where the first microlens has a convex upper surface and a concave lower surface whose curvature conforms to a curvature of an upper surface of a layer below the first microlens; and
a color filter disposed on the upper surface of the substrate and below the first microlens, wherein the color filter includes four regions that respectively correspond to the four photodiodes and extracts a light component that has a predetermined wavelength from the primarily refracted incident light and produces secondarily refracted light,
wherein, in a direction parallel to the direction in which the pixel areas are arranged, a first length of the first microlens is twice a diameter of the circular convex upper surface of each of the four regions, and
wherein in a direction that is diagonal to the direction in which the pixel areas arranged, a second length of the first microlens is greater than twice the diameter of the circular convex upper surface of each of the four regions.

* * * * *